(12) United States Patent
Kido

(10) Patent No.: US 7,807,341 B2
(45) Date of Patent: Oct. 5, 2010

(54) METHOD FOR FORMING ORGANIC MASK AND METHOD FOR FORMING PATTERN USING SAID ORGANIC MASK

(75) Inventor: Shusaku Kido, Izumi (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 1167 days.

(21) Appl. No.: 11/104,553

(22) Filed: Apr. 13, 2005

(65) Prior Publication Data

US 2005/0230348 A1  Oct. 20, 2005

(30) Foreign Application Priority Data

Apr. 14, 2004  (JP) .............................. 2004-119679

(51) Int. Cl.
*G03F 7/00* (2006.01)
(52) U.S. Cl. ...................... 430/330; 430/311; 430/313; 430/314; 430/322; 430/326; 216/58; 216/83
(58) Field of Classification Search ................. 430/311, 430/313, 314, 322, 330, 326; 216/58, 83
See application file for complete search history.

(56) References Cited

U.S. PATENT DOCUMENTS

| 4,133,907 | A * | 1/1979 | Brewer .......................... 430/296 |
| 5,683,857 | A * | 11/1997 | Shirai et al. .................. 430/326 |
| 6,380,006 | B2 * | 4/2002 | Kido ............................ 438/149 |
| 2002/0146911 | A1 * | 10/2002 | Muranaka et al. ........... 438/745 |
| 2003/0186170 | A1 * | 10/2003 | Yamashita ................... 430/311 |

FOREIGN PATENT DOCUMENTS

| JP | 06-332196 | 12/1994 |
| JP | 7-7757 | 1/1995 |
| JP | 8-195505 | 7/1996 |
| JP | 09-279367 | 10/1997 |
| JP | 3157634 | 2/2001 |
| JP | 2002-083765 | 3/2002 |
| JP | 2002-231603 | 8/2002 |
| JP | 2003-86493 | 3/2003 |
| JP | 2003-282422 | 10/2003 |

OTHER PUBLICATIONS

Japanese Patent Office issued a Japanese Office Action, Application No. 2004-119679.

* cited by examiner

*Primary Examiner*—Thorl Chea
(74) *Attorney, Agent, or Firm*—Young & Thompson

(57) ABSTRACT

A method for forming an organic mask, includes:
permeating an organic solvent into an organic pattern formed on a base film and containing at least one kind of organic material, by contacting the organic pattern with the organic solvent; and
thereby, partially or entirely decreasing original adhesion strength between the base film and the organic pattern. A heat treatment may be conducted after contacting to adjust the adhesion strength. Using the organic pattern as a mask, isotropic etching is conducted. As a result, a desired taper angle of the etched base film can be achieved with high accuracy. The taper angle of the etched base film is adjustable by controlling the adhesion strength through the heat treatment.

10 Claims, 16 Drawing Sheets

A RELATION BETWEEN TAPER ANGLE AND RE-BAKE TEMPERRATURE FOR ADHESION STRENGTH ADJUSTMENT (RE-BAKE TIME : 120 SECONDS)

RE-BAKE TEMPERATURE(°C)
FOR ADJUSTING ADHESION STRENGTH
AFTER DISSOLUTION REFLOW

A RELATION BETWEEN TAPER ANGLE AND RE-BAKE
TEMPERRATURE FOR ADHESION STRENGTH ADJUSTMENT
(RE-BAKE TIME : 120 SECONDS)

LITHOGRAPHY

POST-BAKE

ORGANIC SOLVENT CONTACT (WITHOUT REFLOW)

ADHESION ADJUSTMENT TREATMENT

WET ETCHING OR ISOTROPIC DRY ETCHING

TAPER ANGLE ADJUSTMENT TREATMENT

ANISOTROPIC DRY ETCHING

LARGE TAPER ANGLE
WITHOUT REFLOW

DISSOLUTION REFLOW
TREATMENT
(SMALL→LARGE)

LARGE TAPER ANGLE
SMALL DISSOLUTION REFLOW

MIDDLE TAPER ANGLE
MIDDLE DISSOLUTION REFLOW

SMALL TAPER ANGLE
LARGE DISSOLUTION REFLOW

METHOD FOR FORMING ORGANIC MASK AND METHOD FOR FORMING PATTERN USING SAID ORGANIC MASK

BACKGROUND OF THE INVENTION

1. Field of the Invention

The present invention relates to a method for forming an organic mask and a method for forming a pattern using the organic mask.

For the purpose of sufficiently explaining the current level of the art related to the present invention, descriptions of all patents, patent applications, patent gadgets, scientific literatures and the like quoted or specified herein are incorporated herein by reference in its entirety.

2. Description of the Related Art

A process for etching a base film using a resist pattern as a mask is an essential process for fabricating semiconductor devices. There are two types of etching, isotropic etching exemplified by wet etching and anisotropic etching exemplified by dry etching. The isotropic etching in the present invention means that the etching proceeds to right and left directions as well as up and down directions, while etching speeds of right and left directions are not always equal to those of up and down directions On the other hand, the anisotropic etching in the present invention means that etching speeds of right and left directions and up and down directions are substantially different such that the etching does not substantially proceed to under the organic mask. However, in the dry etching, the characteristics are different by, for example, a method of plasma discharge, a treatment pressure, an etching target material, and etching treatment gases, thereby resulting in rather isotropic (hereinafter, referred to as isotropic dry etching) in some case and rather anisotropic (hereinafter, referred to as anisotropic dry etching) in other case. A more suitable etching is selected from these etchings having different characteristics by considering practical etching conditions. When a side wall of the base film, which is etched using a resist pattern as a mask, is perpendicular or inverse tapered, if an upper film is formed after removing the resist mask, the step coverage becomes poor, thereby resulting in inducing film defects, for example, electrical insulation failure and breaking of wire. Therefore, an etched base film pattern is strongly requested to be tapered regardless of each etching methods described in the above.

A related art achieving a tapered angle of an etched base film using wet etching has been disclosed in reference 1 (Japanese Patent No. 3157634, paragraph No. 0013, 0014, FIG. 4). A resist is coated on a chromium film which is formed on a substrate as a base film to be etched. A resist pattern is formed through a light exposure process and a subsequent development process. For increasing hydrophilic property of the interface between the chromium film and the resist, a high hydrophilicity treatment is conducted under conditions of hydrophilicity saturation condition which is controlled by a liquid temperature and a dipping time of the treatment. The chromium film is wet etched and patterned to form a pattern having a taper. According to this related art, the etched edge of chromium film is tapered by implementing a hydrophilic treatment which increases hydrophilic property between the resist and the chromium film.

In addition, another related art taperizing a wet etched edge of chromium film, which is to be etched, has been disclosed in reference 2 (Japanese Laid-open Patent Publication No. 7-7757, fourth column 1-15 lines, FIG. 1). A resist which contains phenol novolac resin as a main chain is patterned into a predetermined pattern on a chromium film formed as a base film, which is to be etched, on a substrate. Then, the chromium film is wet etched with an etching solution containing nitric acid 2 mol/little or more, thereby resulting in a taper shape of the etched edge of chromium film. By dipping the substrate into the etching solution which is increased in concentration of nitric acid, the resist pattern is caused to peel off by the nitric acid of high concentration in the etching solution. In addition, the chromium film is oxidized by oxidants in the etching solution and released into the etching solution as ions. Accordingly, the etching proceeds. As a result, the etched edge of chromium film becomes a taper shape. That is, according to this related art, the etched edge of chromium film is tapered by increasing concentration of nitric acid in the etching solution.

A related art which taperizes a dry etched edge of chromium film, which is to be etched, has been disclosed in reference 3 (Japanese Laid-open Patent Publication No. 8-195505, paragraph No. 0019, 0020, FIG. 1). A p-n junction layer consisting of p-type GaP layer and n-type GaP layer is formed on GaP substrate. Then, a resist pattern is formed after coating a resist on the p-n junction layer through a light exposure process and a development process. After that, the resist pattern is distorted into a hemispheric shape using thermal reflow of the resist pattern. Through dry etching using the distorted resist pattern as a mask, the hemispheric shape pattern is copied on a film to be etched, while the resist recedes.

Another related art taperizing a dry etched edge of chromium film, which is to be etched, has been disclosed in reference 4 (Japanese Laid-open Patent Publication No. 2003-86493, paragraph No. 0011, FIG. 8). When a base material is dry etched using a normally tapered shape pattern as a mask, if an etching selectivity between the pattern and the base material is poor, the pattern thereof is reduced in the dry etching of the base material. Due to reduction of the pattern, a layer thickness at a skirt of the pattern gradually decreases in thickness, thereby partially decreasing in thickness of the base material pattern. However, defective shapes are caused at the edge of base material, thereby, failing in obtaining a desired length of the base material pattern.

The related arts disclosed in the four references which are described in the above are all able to achieve taperization of etching surface to be etched. However, the taper angle of the etched base film pattern is determined by the conditions of the resist mask and the etching thereof. Therefore it has been difficult to control and adjust the taper angle in wide range and with high accuracy.

In addition, in the related arts disclosed in references 1 and 2, when an adhesion strength of the resist mask with the base film before the treatment described in the references 1 and 2 is low, there has been a possibility that the taper angle may become too large compared with a desired angle, and the resist mask may be caused to peel off at a wet etching process which uses the resist mask. In addition, when the adhesion strength of the resist mask with the base is high, there has been a possibility that the taper angle may become too small, or not tapered in the technologies disclosed in the references 1 and 2.

Accordingly, it has been expected to provide a method for forming an organic mask and an etching method using the organic mask, which are free from the issues of the related arts.

BRIEF SUMMARY OF THE PRESENT INVENTION

It is therefore an object of the present invention to provide a method for forming a mask (hereinafter, referred to as organic mask) using an organic film which is free from the above issues and problems in the related arts.

It is another object of the present invention to provide an etching method which is free from the issues and problems that the above related arts have.

It is a further object of the present invention to provide a new method for forming an organic mask for an isotropic etching, in which the organic mask has a sufficient adhesion strength with a base film at a central part of the organic mask after a treatment process of the present invention, while the adhesion strength of the organic mask with the base film at a periphery of the organic mask is coordinated to be weak, regardless of the adhesion strength of the organic mask with the base film before the treatment process of the present invention.

It is a still further object of the present invention to provide a new isotropic etching method which is able to control and adjust a taper angle of an etched base film pattern in wide range and with high accuracy, while avoiding peeling off of an organic mask, by isotropically etching the base film using the organic mask for the isotropic etching, the organic mask being coordinated so that the organic mask has a sufficient adhesion strength with the base film at a central part of the organic mask, while the adhesion strength at the periphery of the organic mask with the base film is low.

It is a yet further object of the present invention to provide a new method for forming an organic mask, of which taper angle at the tapered periphery is adjusted, for anisotropic etching.

It is an additional object of the present invention to provide a new anisotropic etching method which is able to control and adjust a taper angle of an etched base film pattern in wide range and with high accuracy by anisotropically etching the base film using an organic mask for anisotropic etching, of which taper angle at the tapered periphery of the organic mask is adjusted.

It is another additional object of the present invention to provide a chemical solution and a method for using the chemical solution to make easy that an organic solvent easily permeate into an organic pattern by a treatment or removing a deteriorated layer on a surface of the organic film.

METHOD FOR SOLVING THE PROBLEMS

[A Method for Forming an Organic Mask for Wet Etching or Isotropic Dry Etching]

According to a first aspect of the present invention, the present invention provides a method for forming an organic mask comprising a step of forming the organic mask in which a part of or all of an original adhesion strength between a base film and an organic pattern is decreased by permeating an organic solvent into the organic pattern through contacting the organic pattern, which is formed on the base film and includes at least one organic material, with the organic solvent.

Specifically, the organic solvent is permeated from a surface to an inside of the organic pattern, thereby causing a volume expansion of the organic pattern at a portion of the organic solvent is permeated (hereinafter, referred to as organic solvent permeated portion). The adhesion strength between a bottom of the organic pattern where the organic solvent is not permeated (hereinafter, referred to as organic solvent non-permeated portion) and the base film is maintained. On the contrary, the adhesion strength between a bottom of organic solvent permeated portion and the base film is decreased, thereby decreasing the adhesion strength at the bottom of organic solvent permeated portion lower than that at the bottom of organic solvent non-permeated portion. It is important to implement a heat treatment of adhesion strength adjustment for increasing the adhesion strength, which is once decreased, after contact process with the organic solvent.

[A Method for Forming a Pattern Using Wet Etching or Isotropic Dry Etching]

In addition, according to a second aspect of the present invention, the present invention provides a method for forming a pattern comprising a step of forming an organic mask in which a part of or all of an adhesion strength between a base film and an organic pattern is decreased by permeating an organic solvent into the organic pattern through contacting the organic pattern, which is formed on the base film and includes at least one organic material, with the organic solvent, and also a step of wet etching or isotropic dry etching of the base film using the organic mask.

Specifically, the organic solvent is permeated from a surface to an inside of the organic pattern, thereby causing a volume expansion of the organic pattern at a portion of organic solvent permeated portion. The adhesion strength between the bottom of organic pattern at organic solvent non-permeated portion and the base film is maintained. On the contrary, the adhesion strength between the bottom of organic pattern at organic solvent permeated portion and the base film is decreased, thereby decreasing the adhesion strength at the bottom of organic solvent permeated portion lower than that of organic solvent non-permeated portion. In addition, it is important to conduct a heat treatment of adhesion strength adjustment within the adhesion strength lower than that of before the organic solvent is permeated for increasing the adhesion strength, which is once decreased, at the bottom of organic solvent permeated portion after a contact process with the organic solvent.

The first and the second aspects of the present invention are based on a fact that a taper angle of an isotropically etched base film can be adjusted by controlling a decrease of adhesion strength between a periphery portion of organic mask and the base film. That is, when the organic mask is used as a mask for isotropic etching exemplified by wet etching, the degree of decrease in adhesion strength at the periphery of organic mask is important for taperizing the isotropically etched base film. In other word, by controlling the degree of decrease in adhesion strength at the periphery portion of organic mask, the taper of isotropically etched base film can be adjusted. A speed of isotropic etching in horizontal direction at an upper portion of base film is increased due to decrease of the adhesion strength between the base film and the periphery portion of organic mask. As a result, the taperization of isotrpically etched base film is increased, that is, the taper angle becomes small. On the contrary, due to increase in the adhesion strength between the base film and the periphery portion of organic mask, the speed of the isotropic etching in horizontal direction at the upper portion of base film is decreased. As a result, the taperization of isotrpically etched base film is decreased, that is, the taper angle becomes large. Therefore, the speed of isotropic etching in horizontal direction at upper portion of base film can be adjusted by controlling the level of decrease in adhesion strength between the base film and the periphery portion of organic mask by adjusting a heat treatment of the adhesion strength adjustment. Accordingly, a degree of taperization of isotrpically etched base film, that is, the taper angle, can be adjusted.

Then, a contact process of organic pattern with the organic solvent must be continued for permeating the organic solvent under the bottom of organic pattern beyond a predetermined position of final etching at the upper portion of base film. In other word, it is favorable to stop the isotropic etching before the etching position in horizontal direction at the upper portion of base film exceeds a border between the organic solvent permeated portion and the organic solvent non-permeated portion.

In addition, a volume of organic solvent permeation may be large in some case for causing a dissolution reflow, and may be small in other case for not to cause the dissolution reflow. To cause, or not to cause the dissolution reflow is determined considering a necessary distance in horizontal direction at the bottom of organic solvent permeated portion, where the adhesion strength is decreased. When the dissolution reflow is necessary due to a large necessary distance in horizontal direction at the bottom of organic solvent permeated portion, the permeation volume of organic solvent is increased for causing the dissolution reflow. When the necessary distance in horizontal direction at the bottom of organic solvent permeated portion is small, since the dissolution reflow is not essential, the permeation volume of organic solvent as much as causing the dissolution reflow is not needed in this case. That is, to cause and not to cause the dissolution reflow are both applicable. A tapered organic mask can be obtained by causing the dissolution reflow. However, when the organic mask is used as an etching mask for isotropic etching exemplified by wet etching, a taper angle of isotropically etched base film is effected by the adhesion strength between the base film and the bottom of periphery portion of organic mask, but not effected by a taper shape of the organic mask.

[A Method for Forming an Organic Mask for Anisotropic Etching]

According to a third aspect of the present invention, the present invention provides a method for forming an organic mask for anisotropic etching comprising a step of forming the organic mask, of which periphery portion is tapered, by permeating the organic solvent from a surface to an inside of organic pattern contacting with the organic pattern which is formed on the base film and includes at least one organic material, thereby causing a volume expansion and dissolution reflow of the organic pattern at organic solvent permeated portion. In addition, when a taper angle of organic pattern formed by the dissolution reflow is smaller than that of a desired angle, it is important to adjust the taper angle so that it becomes the desired angle by increasing the taper angle of organic mask with a heat treatment for adjusting the taper angle after the dissolution reflow.

[A Method for Forming a Pattern Using Anisotropic Etching]

According to a fourth aspect of the present invention, the present invention provides a method for etching comprising a step of forming the organic mask of which periphery portion is tapered by permeating the organic solvent from a surface to an inside of organic pattern contacting with the organic pattern which is formed on the base film and includes at least one organic material, thereby causing a volume expansion and dissolution reflow of the organic pattern at organic solvent permeated portion, and a step of anisotropic etching of the base film using the organic mask. In addition, when a taper angle of organic pattern formed by the dissolution reflow is smaller than that of a desired angle, it is important to adjust the taper angle so that it becomes the desired angle by increasing the taper angle of organic mask with a heat treatment for adjusting the taper angle after the dissolution reflow.

The third and fourth aspects of the present invention is based on a fact that a taper angle of anisotropically etched base film can be adjusted by adjusting a taper angle of peripheral portion of organic mask. That is, a decrease in taper angle of the tapered peripheral portion of organic mask contributes to increase in receding speed of the tapered peripheral portion at anisotropic etching when the anisotropic etching condition is the same. Increase in the receding speed contributes to decrease in anisotropically etched taper angle of base film. In other word, to make a taper angle of tapered peripheral portion of organic mask small contributes to make easy a taper angle of anisotropically etched base film to become small.

As described in the above, when the organic mask is used for isotropic etching, exemplified by wet etching, a taper angle of isotropically etched base film can be controlled by adjusting a level of decrease in adhesion strength between the base film and the periphery portion of organic mask. On the other hand, when the organic mask is used for anisotropic etching, exemplified by dry etching, a taper angle of anisotropically etched base film can be controlled by adjusting a taper angle of the periphery portion of organic mask.

[Chemical Solution and a Method for Using the Chemical Solution]

According to a fifth aspect of the present invention, the present invention provides a chemical solution for treating or removing a deteriorated surface layer of organic film. The chemical solution may contain at least one kind of amines with concentration of 0.05~10 wt %. Preferably, the chemical solution may contain at least one kind of amines with concentration of 0.05~3 wt %. A typical example of the amines may include monoethylamine, diethylamine, triethylamine, monoisopropylamine, diisopropylamine, monobutylamine, dibutylamine, tributylamine, hydroxylamine, diethylhydroxylamine, diethylhydroxylamine anhydride, pyridine, and picoline. The chemical solution may contain at least one kind of the above amines. The at least one kind of the amines described in the above is typically mixed with water. The chemical solution may also contain an antiseptic agent.

The fifth aspect of the present invention provides a chemical solution for making easy to permeate an organic solvent into an organic pattern by selectively treating or removing the deteriorated surface layer of the organic film, while leaving a non-deteriorated portion of organic film as it is. For example, by applying the fifth aspect of the present invention to a method for forming the organic mask or the pattern in the above first to fourth aspects of the present invention, organic solvent permeation into the organic pattern becomes easy by treating or removing the deteriorated surface layer of the organic film with the chemical solution. Practically, cracks are introduced in the deteriorated layer, or a part of or all of deteriorated layer is removed by treating the deteriorated surface of organic film with the chemical solution. Therefore, it becomes possible to avoid prevention of organic solvent permeation into the organic pattern by the deteriorated layer at the organic solvent permeation process in the method of forming the organic mask, or the pattern in the first to fourth aspects of the present invention. In this process, it is important to use a chemical solution which makes easy to permeate the organic solvent into the organic film without removing or peeling off the organic film by selectively removing the deteriorated layer or introducing cracks in the deteriorated layer, while leaving the non-deteriorated portion of organic film as it is.

ADVANTAGES OF THE INVENTION

According to the first and second aspects of the present invention, by isotropically etching the base film using an organic mask for isotropic etching, the organic mask being controlled to have a sufficient adhesion strength with the base film at a central part of organic mask while the adhesion strength at the periphery portion is low, it becomes possible to control and adjust a taper angle of etched base film pattern in wide range and wide freedom with high accuracy, while avoiding peeling off of the organic mask.

According to the third and fourth aspects of the present invention, it becomes possible to control and adjust a taper angle of the etched base film pattern in wide range and wide freedom with high accuracy by anisotropically etching the base film using an organic mask, of which taper angle of the tapered peripheral portion is adjusted, for anisotropic etching.

According to the fifth aspect of the present invention, it becomes possible to avoid prevention of the organic solvent permeation into the organic pattern by the deteriorated layer at the organic solvent permeation process by treating or removing the deteriorated surface layer of the organic film using a chemical solution containing at least one kind of amines with concentration range of 0.05~10 wt %.

PREFERRED EMBODIMENTS OF THE PRESENT INVENTION

[A Method for Forming an Organic Mask for Wet Etching or Isotropic Dry Etching and a Method for Forming a Pattern Using the Organic Mask]

According to the first and second aspects of the present invention, an organic solvent permeates from a surface to inside of the organic pattern with time by contacting the organic pattern with the organic solvent. That is, a portion where the organic solvent is permeated (hereinafter, referred to as organic solvent permeated portion) spreads from the surface to inside with time. Then, the organic solvent permeated portion expands its volume. As a result, a side edge of organic pattern after expansion by contacting with the organic solvent is located at an outside position compared with an original position before contacting with the organic solvent. Therefore, a bottom of expanded portion by organic solvent permeation (hereinafter, referred to as bottom permeated expansion portion), where is expanded to outside from the original position of the side edge, has a substantially weak adhesion strength with the base film. The bottom permeated expansion portion corresponds to a part of the bottom of organic solvent permeated portion.

Since the organic solvent permeated portion spreads from a surface to the inside with time, a bottom of the organic solvent permeated portion is consist of the bottom permeated expansion portion where is located at outside of the original position of side edge of organic pattern before contacting with the organic solvent, and a portion where is located at inside of the original position (hereinafter, referred to as bottom permeated inner portion). The adhesion strength of the bottom permeated inner portion is decreased since the organic solvent is also permeated, thereby expanding the volume. That is, the bottom permeated inner portion has a weak adhesion strength, but not so weak as that of the bottom permeated expansion portion. The bottom of the organic pattern is consist of the bottom permeated expansion portion, the bottom permeated inner portion, and a bottom non-permeated portion which is a bottom of non-permeated portion where the organic solvent is not permeated (hereinafter, referred to as organic solvent non-permeated portion). Because the organic solvent non-permeated portion, where the organic solvent is not permeated, is not expanded, the adhesion strength of the organic solvent non-permeated portion with the base film is not decreased. Therefore, the adhesion strength is maintained at the level before contacting the organic pattern with the organic solvent. Then, the bottom of organic pattern, of which volume is expanded by the contact with the organic solvent, is consist of the organic solvent non-permeated portion of which adhesion strength with the base film is not decreased and the organic solvent permeated portion of which adhesion strength with the base film is decreased. The organic solvent permeated portion is consist of the bottom permeated expansion portion, where is located at outside of the original position of side edge of organic pattern before contacting with the organic solvent, and the bottom permeated inner portion, where is located at inside of the original position of the side edge.

After stopping contact with the organic solvent, a heat treatment for adjusting the adhesion strength is conducted for increasing the adhesion strength, which is once decreased, of the bottom of organic solvent permeated portion within a range of adhesion strength below that of the bottom of organic solvent non-permeated portion. That is, as described in the above, a decrease in adhesion strength between the base film and the bottom of organic solvent permeated portion, where the organic solvent is permeated, contributes to decrease a taper angle of the base film pattern etched by isotropic etching exemplified by wet etching. Because of decrease in adhesion strength with the base film due to permeation of the organic solvent, a practical taper angle of the base film pattern is generally over-decreased, as a result, the taper angle will result in smaller than that of the desired angle in general. In this case, the heat treatment for adjusting the adhesion strength is conducted for increasing the adhesion strength, which is once decreased, of the bottom of organic solvent permeated portion of organic pattern. Increase in the adhesion strength contributes to increase in the taper angle of isotropically etched base film pattern. That is, due to decrease in adhesion strength between the base film and the organic solvent permeated portion of organic pattern at contact process to the organic solvent, an etching speed of isotropic etching in horizontal direction is increased at an upper portion of the base film, thereby resulting in increase in taperization of isotropically etched base film, that is, the taper angle becomes small. However, by conducting the heat treatment for adjusting the adhesion strength after contact process of organic solvent, the adhesion strength between the base film and the bottom of organic solvent permeated portion of organic pattern is increased. As a result, the etching speed of isotropic etching in horizontal direction is decreased at the upper portion of base film, thereby resulting in decrease in taperization of isotropically etched base film, that is, the taper angle becomes large.

Therefore, by controlling a level of decrease in adhesion strength between the base film and the periphery portion of organic mask through the heat treatment for adjusting the adhesion strength, a control of etching speed of isotropic etching becomes possible in horizontal direction at an upper portion of base film. As a result, a degree of taperization of isotropically etched base film, that is, the taper angle can be controlled. However, it is important to conduct a heat treatment for adjusting the adhesion strength at a temperature and a time increasing the adhesion strength, which was once decreased, of the bottom of organic solvent permeated portion within a range of adhesion strength below that of the bottom of organic solvent non-permeated portion. When the adhesion strength is increased by the heat treatment higher than that of the bottom of organic solvent non-permeated portion before the heat treatment of adhesion strength adjustment, the above mechanism of taperization of base film can not be applied. Therefore, for using the mechanism of taperization of base film, it is necessary that the adhesion strength, which was once decreased, of the bottom of organic solvent permeated portion is increased by conducting the heat treatment of adhesion strength adjustment, however, the increased adhesion strength must be still lower than that of the bottom of organic solvent non-permeated portion before the heat treatment of adhesion strength adjustment.

In addition, a level of increase of the adhesion strength, which was once decreased, of the bottom of organic solvent permeated portion depends on a temperature and a time of the heat treatment of adhesion strength adjustment. When the temperature for adjusting the adhesion strength is fixed, an increase of time for the heat treatment contributes to increase the level of adhesion strength. On the contrary, a decrease of time for the heat treatment contributes to decrease the level of adhesion strength. When the time for adjusting the adhesion strength is fixed, an increase of temperature for the heat treatment contributes to increase the level of adhesion strength. On the contrary, a decrease of the temperature for the heat treatment contributes to decrease the level of adhesion strength. Practically, for fixing the temperature and the time for adjusting the adhesion strength, a change of taper angle of isotropically etched base film pattern is measured by independently varying the time and the temperature of the heat treatment, while conditions other than the heat treatment are fixed. Therefore, optimal temperature and time of the heat treatment for adjusting the adhesion strength can be quantitatively fixed according to a desired taper angle of base film pattern.

The conditions other than the heat treatment are, for example, in wet etching, (1) Composition of etching solution, (2) Temperature of etching solution, (3) Spray condition of etching solution (in case of shower method: shower pressure, oscillation frequency of shower, etc.), (4) Etching time, (5) Water rinse method, (6) Drying method (temperature, time), and in isotropic dry etching, (1) Pressure at etching (vacuum level), (2) Discharge power, (3) Etching gas and its flow rate, (4) Etching time, (5) Substrate temperature (temperature of substrate stage). A temperature range of the heat treatment for adjusting the adhesion strength is not limited. For example, the range may be 0° C. to 150° C. However, optimally, it may be 40° C. to 120° C. That is, the heat treatment includes a process setting the organic pattern at around room temperature and or less, as well as at higher temperature than room temperature.

As described in the above, the purpose of the heat treatment for adjusting the adhesion strength is to control the adhesion strength so as to increase the adhesion strength, which was once decreased, of the bottom of organic solvent permeated portion of organic pattern when the practical taper angle of the base film is smaller than a desired angle due to decrease of the adhesion strength with the base film by permeation of the organic solvent. Therefore, the heat treatment for adjusting the adhesion strength is not necessary when a practical taper angle of base film is equal to the desired angle due to decrease of adhesion strength with the base film by organic solvent permeation.

At a heat treatment process for adjusting the adhesion strength, the organic solvent permeated in the organic pattern evaporates. As a result, a volume of organic solvent permeated portion of organic pattern, which was once expanded, shrinks. However, since the shrunk volume is almost equal to or less than that of advanced expanded volume, a dimension of the organic pattern in horizontal direction after the heat treatment of adhesion strength adjustment does not become small compared with that of before the contact process with the organic solvent. The organic solvent permeated in the organic pattern also naturally evaporates when the heat treatment for adjusting the adhesion strength is not conducted. Then, a volume shrinkage of organic solvent permeated portion of organic pattern, once expanded, also takes place. However, it is less than that of the heat treatment. As a result, a dimension of organic pattern in horizontal direction after natural evaporation does not become smaller than that of before the contact process with the organic solvent.

Accordingly, the adhesion strength at least at the bottom of periphery portion of organic mask is lower than that of central portion. This fact contributes to the taperizarion of etched base film when isotropic etching for the base film is conducted using the organic mask. For example, when isotropic etching, especially wet etching, which is superior in isotropy, is conducted, although the base film, which is to be etched, has high adhesion strength with a base structure located directly below the base film and also with the bottom of central portion of organic mask located directly upper the base film, however, the adhesion strength of the base film with the bottom of periphery portion of organic mask located directly upper the base film is low. As a result, when an over-etch is conducted in isotropic etching, an etching speed at the upper portion of base film, at where the adhesion strength is low, is larger in horizontal inside direction than that of the bottom portion, at where the adhesion strength is high, of the base film. Then, the upper portion of the base film is etched faster in horizontal inside direction than that of the bottom portion, thereby resulting in a taper shape of the etched base film. That is, the etched base film is normally tapered such that a width of the base film becomes narrower with leaving from the bottom.

When an etching position of the base film upper portion in horizontal direction is located under the bottom of organic solvent permeated portion of organic mask, the etching speed of base film in horizontal inside direction is fast at the upper portion and slow at the bottom portion, thereby resulting in taper of the base film. However, when the etching position of the base film upper portion in horizontal direction is located under the bottom of organic solvent non-permeated portion, the etching speed of base film in horizontal inside direction becomes slow at the upper portion, thereby resulting in decrease in taperization of the base film. Therefore, it is favorable that a border between the bottom of organic solvent permeated portion and that of organic solvent non-permeated portion is located at inside a final etching position of the upper portion of base film. In other words, for obtaining a sufficient effect of taperization of etched base film, it is favorable to continue the contact process of organic solvent so that the organic solvent permeates into the bottom of organic pattern beyond a predetermined deepest etching position of the upper portion of base film.

A process for contacting the organic pattern to the organic solvent may include a process for exposing the organic pattern to an organic solvent mixed gas containing the organic solvent. The organic solvent mixed gas may include a vapor of the organic solvent or a mixed gas mixing the organic solvent with an inert gas, for example, nitrogen gas. The process for contacting the organic pattern to the organic solvent may include a process for dipping the organic pattern into a solution containing the organic solvent. A permeation depth of the organic solvent into the organic pattern, that is, a permeation volume, depends on a material composing the organic pattern, a concentration of the organic solvent in the organic solvent mixed gas or a concentration of the organic solvent in the solution, and a contact time contacting the organic pattern with the organic solvent, that is, a treating time. It is likely to happen that the material composing the organic pattern is selected considering other factors than the permeation depth of the organic solvent into the organic pattern. Therefore, a control of the permeation depth of the organic solvent into the organic pattern, that is, a permeation volume, can be achieve by controlling the concentration of the organic solvent in the organic solvent mixed gas or the concentration of the organic solvent in the solution, and the contact time contacting the organic pattern with the organic solvent, that is, the treating time.

When a permeation volume of an organic solvent into an organic pattern is small, a dissolution reflow does not take place. On the other hand, when the permeation volume is large, the dissolution reflow takes place. A critical value of the permeation volume for causing the dissolution reflow depends on physical properties and concentration of the organic solvent, and conditions including physical properties of the organic pattern. At any rate, when the permeation volume of an organic solvent into an organic pattern is less than the critical value, the dissolution reflow does not take place, and when the permeation volume is more than the critical value, the dissolution reflow takes place. Therefore, if a desired dimension in horizontal direction at the bottom of organic solvent permeated portion, at where the adhesion strength is adjusted, is substantially equal to the permeation depth of the organic solvent, and if an organic pattern distortion by the dissolution reflow is not necessary, by stopping the contact process contacting the organic mask with the organic solvent before the dissolution reflow of the organic pattern takes place, it becomes possible to prepare an organic mask which is not tapered and has lower adhesion strength at the bottom of organic solvent non-permeated portion rather than at the bottom of organic solvent permeated portion.

For example, it may become necessary that only a small area where is not a central area of the bottom of organic pattern, that is, only a peripheral portion, has low adhesion strength with the base film. In this case, the dissolution reflow does not take place since the necessary permeation volume of the organic solvent into the organic pattern is little bit. However, since the adhesion strength with the base film at the periphery portion of the bottom of organic pattern is lowered, the wet etched base film has a normally tapered shape as described in the above.

On the other hand, if a desired horizontal direction dimension at the bottom of the organic solvent permeated portion, at where the adhesion strength with the base film is adjusted, is larger than the permeation depth of the organic solvent and also a pattern distortion of organic pattern is necessary by the dissolution reflow, an organic mask which is tapered and has lower adhesion strength at the bottom of organic solvent non-permeated portion rather than at the bottom of organic solvent permeated portion may be prepared, by continuing the contact process contacting the organic mask with the organic solvent until the dissolution reflow of the organic pattern takes place.

Generally, a post-bake is conducted after forming the organic pattern by patterning on an organic film for securing sufficient adhesion strength between the base film and the organic pattern, thereby preventing from peeling off the organic pattern from the base film when the organic mask is used as an etching mask in later etching process. Therefore, a process that increases the adhesion strength between the bottom of the organic pattern and the base film through a heat treatment before contacting the organic pattern with the organic solvent is also included in the present invention. This heat treatment includes at least a pre-bake treatment which is conducted before forming the organic pattern and a post-bake treatment conducted after forming the organic pattern. For example, the post-bake is conducted in general, however, in addition to, or instead of the post-bake, the pre-bake may be conducted. This heat treatment implemented before the organic solvent permeation process is preferably conducted at a temperature higher than the minimum temperature necessary for increasing the adhesion strength between the base film and the bottom of organic pattern, and lower than the temperature that deteriorates characteristics of the organic pattern, thereby preventing permeation of the organic solvent. The heat treatment is also preferably conducted at lower temperature than that of causing thermal reflow. A temperature range of this heat treatment is not limited, however, it may be a range of 100° C. to 150° C. as one of the typical example.

The purpose of heat treatment process implemented before contacting the organic pattern with the organic solvent is to increase the adhesion strength between the base film and the organic pattern, and the purpose is not to cause the thermal reflow of the organic pattern. That is, the main purpose of the heat treatment is to increase the adhesion strength between the base film and the bottom of organic pattern, thereby preventing from peeling off of the organic pattern from the base film in the later processes.

When isotropic etching is conducted under the condition of high adhesion strength between the base film and the bottom of organic pattern, as described in the above, an etching speed in horizontal direction at an upper portion of base film adjacent to the bottom of organic pattern is slow, thereby a large difference of the etching speed in horizontal direction between at the bottom and at the upper portions of base film does not take place. Therefore, a taperization of the isotropically etched base film pattern is difficult. According to the present invention, as described before, an organic solvent is permeated into the organic pattern from a surface to an inside by contacting the organic pattern, of which adhesion strength with the base film was increased by the heat treatment, with the organic solvent. Through this process, the adhesion strength between the base film and the bottom of organic solvent permeated portion, where the organic solvent is permeated, of organic pattern is decreased. As a result, when isotropic etching is conducted, an etching speed in horizontal inside direction at the upper portion of base film, where the adhesion strength is low, is larger than that of at the bottom portion of base film where the adhesion strength is high. Therefore, the upper portion of base film is etched faster in horizontal inside direction than the bottom portion of base film, and as a result, the etched base film has a taper shape. That is, the etched base film is normally tapered such that the width of base film becomes narrower with leaving from the bottom. The mechanism of the taperization is the same as described in the above.

If the organic pattern is contacted with the organic solvent without heat treatment, there exists a possibility of peeling off of the organic mask from the base film in the contact process thereof or in later etching process due to insufficient adhesion strength of the base film with the bottom of organic pattern. Therefore, it is preferable to conduct the heat treatment before contacting the organic pattern with the organic solvent for increasing the adhesion strength between the base film and the bottom of organic pattern. As described in the above, the organic solvent permeates into the organic pattern from the surface to the inside even if the adhesion strength is increased high enough. Then, the adhesion strength between the base film and the bottom of organic solvent permeated portion of organic pattern is decreased. However, the adhesion strength between the base film and the bottom of organic solvent non-permeated portion is maintained high enough. Therefore, the peeling off of the organic pattern from the base film is prevented. As a result, taperization of the base film can be achieved according to the reason described before.

When an organic mask is used for isotropic etching exemplified by wet etching, it is possible to control the taper angle of the isotropically etched base film by controlling a level of decrease of the adhesion strength between the base film and a periphery portion of organic mask. On the other hand, an organic mask is used for anisotropic etching exemplified by dry etching, it is possible to control the taper angle of the anisotropically etched base film by controlling a taper angle of the periphery portion of organic mask. A formation method of organic mask for anisotropic etching and the anisotropic etching thereof using the mask will be explained below.

[Formation of Organic Mask for Anisotropic Etching and Anisotropic Etching Using the Mask]

When the base film is etched by anisotropic etching, a taper shape of the organic mask substantially contributes to a taperization of the etched base film. Dry etching is rather anisotropic compared with wet etching in general. Anisotropic etching is exemplified, for example, by reactive ion etching. At the etching process, the organic mask is also etched as well as an etching target film. That is, since an exposed surface of organic mask is etched by etching particles, the periphery of tapered organic mask recedes toward the center of the organic mask. According to the recession of the tapered periphery of organic mask toward the center of organic mask, a newly exposed portion of base film, where has been covered with the organic mask, gradually appears. When the newly exposed portion has appeared by the recession of the tapered periphery, etching for the exposed base film portion starts due to exposure to the etching particles. The recession of the tapered periphery portion of organic mask proceeds from the outside to the inside of organic mask with time. Then, the exposed base film portion expands from the outside to the inside with time. Therefore, etching for the outer exposed portion of exposed base film starts at earlier timing than that of the inner portion due to earlier exposure to the etching particles. As a result, the outer exposed portion is exposed longer time to the etching particles than the inner exposed portion. That is, the outer exposed portion is etched deeper than the inner exposed portion. Accordingly, the surface of etched base film is tapered, and the etched base film has a taper shape.

In addition, there is a tendency that the more the side wall slope of the organic mask is gentle, that is, the smaller the taper angle of the organic mask is, the faster the recession speed by anisotropic etching of the tapered periphery portion of organic mask is. The recession speed means a speed that a portion, where is not the central part of the tapered organic mask, that is, the periphery portion recedes to the center of organic mask. If the recession speed is fast, the slope of etching surface of the etching target film, which is a base film, becomes gentle. As a result, a taper of the etched base film becomes small. Accordingly, a substantially tapered base film pattern can be obtained.

As described before, the organic pattern is tapered by causing the dissolution reflow of organic pattern. With sufficient dissolution reflow, a taper angle of organic pattern implemented the dissolution reflow can be sufficiently small. By conducting a heat treatment for adjusting the taper angle of organic pattern after dissolution reflow, it becomes possible to shrink the volume of organic solvent permeated portion of organic pattern and to increase the taper angle thereof. That is, if the taper angle of organic pattern after dissolution reflow is smaller than a desired taper angle of organic mask, it is important to adjust the taper angle so that it becomes the desired taper angle by increasing the taper angle of organic pattern through implementation of heat treatment for adjusting the taper angle after dissolution reflow. A dissolution reflowed taper angle of the organic pattern is small in general compared with a practically required taper angle of organic mask. In this case, the taper angle is adjusted by implementing a heat treatment for adjusting the taper angle after the dissolution reflow.

Adjustment of dissolution reflow volume can be implemented as below. When the organic pattern is exposed to an organic solvent mixed gas containing organic solvent, the adjustment of the dissolution reflow volume can be implemented by controlling a concentration of the organic solvent in the organic solvent mixed gas and a time for exposing to the organic solvent mixed gas. On the other hand, when the organic pattern is dipped into a solution containing organic solvent, the adjustment of the dissolution reflow volume can be implemented by controlling a concentration of the organic solvent in the solution and a time for dipping into the solution containing the organic solvent.

In addition, a degree of increase of the taper angle of organic mask after the dissolution reflow depends on temperature and time of the heat treatment for adjusting the taper angle. When the temperature of the heat treatment for adjusting the taper angle of organic mask is fixed, an increase of the heat treatment time increases the degree of increase of the taper angle of organic pattern after the dissolution reflow. On the contrary, a decrease of heat treatment time decreases the degree of increase of the taper angle. When the time of heat treatment for adjusting the taper angle of organic mask is fixed, an increase of the temperature increases the degree of increase of the taper angle, on the contrary, a decrease of the temperature decreases the degree of increase of the taper angle. Practically, for fixing the temperature and the time for adjusting the taper angle of organic mask, a change of the taper angle of base film pattern etched by anisotropic etching is measured by independently varying the time and the temperature of the heat treatment, while other conditions than the heat treatment are being fixed. Therefore, an optimal temperature and time of the heat treatment for adjusting the taper angle of organic mask can be quantitatively fixed according to a desired taper angle of the base film pattern.

The conditions other than the heat treatment are, for example, in anisotropic dry etching, (1) Pressure at etching (vacuum level), (2) Discharge power, (3) Etching gas and its flow rate, (4) Etching time, (5) Substrate temperature (temperature of substrate stage). A temperature range of the heat treatment for adjusting the taper angle of organic mask is not limited. For example, it may be 0° C. to 150° C. However, the range may optimally be 50° C. to 150° C. That is, this heat treatment includes a process setting the organic pattern at around room temperature, or less, as well as heat treatment at higher temperature than room temperature.

As described in the above, the purpose of the heat treatment for adjusting the taper angle is to increase a taper angle of the dissolution reflowed organic pattern when the tapered angle of organic mask by the dissolution reflow is smaller than a desired angle. Therefore, the heat treatment for adjusting the taper angle is not necessary when the tapered angle of the organic mask by dissolution reflow is equal to the desired angle.

At the heat treatment process for adjusting the taper angle, an organic solvent permeated into the organic pattern evaporates. As a result, a volume of organic solvent permeated portion of organic pattern, which was once expanded and dissolution reflowed, shrinks. However, since a value of the shrunk volume in horizontal direction is less compared with a sum of advanced expanded volume and dissolution reflowed volume, a dimension of organic pattern in horizontal direction after the heat treatment for adjusting the taper angle does not become smaller than that of before contact process with the organic solvent. The organic solvent permeated into the organic pattern also naturally evaporates when the heat treatment for adjusting the taper angle is not conducted. As a result, the volume shrinkage of the organic solvent permeated portion of organic pattern, once expanded and dissolution reflowed, also takes place. However, the shrinkage is smaller than that of the heat treatment. As a result, a dimension of the organic pattern in horizontal direction after natural evaporation does not become smaller than that of before contact process with the organic solvent.

In addition, for the present invention, it is important that the reflow of the organic pattern is the dissolution reflow which is caused by substantially permeating the organic solvent into the organic pattern. A reflow of the organic pattern comprises a thermal reflow and a dissolution reflow. The dissolution reflow is superior to the thermal reflow in the following points.

As shown in the cited reference 4 (Japanese Laid-Open Patent Publication No. 2003-86493), a photoresist pattern, which is one of the example of organic pattern, causes following three issues by taperization with the thermal reflow. 1) The first issue is that, since a shape of the reflowed part after the reflow depends on a width of the photoresist, if the width of the photoresist pattern is not uniform, a degree of taperization of the photoresist pattern after the thermal reflow also becomes non-uniform.

The second issue is that the taperization with the thermal reflow accompanies shrinkage of photoresist pattern dimension in horizontal direction. When the heat treatment of the organic pattern is conducted, as described in the above, a volume shrinkage of the organic pattern is caused, while it causes increase in dimension in horizontal direction. That is, the thermal reflow causes the volume shrinkage of the organic pattern by heat, as well as it causes increase in dimension in horizontal direction by fluidization. Therefore, the increase in dimension in horizontal direction is not so large as that of the dissolution reflow. On the other hand, the dissolution reflow does not require heat treatment at high temperature. Therefore, the volume shrinkage of the organic pattern does not take place, while increasing in dimension in horizontal direction due to low temperature treatment which does not require heat treatment at high temperature. As a result, only a volume expansion due to permeation of organic solvent takes place. Therefore, the dissolution reflow is superior to the thermal reflow for shrinking a distance between patterns. A heat treatment is implemented after the dissolution reflow in some case, however, it is conducted for evaporating the permeated organic solvent and for drying the organic pattern, and the temperature is not so high as to cause the thermal reflow. Or, in this case, advantages of combination of the dissolution reflow and the thermal reflow might be expected, and the dissolution reflow treatment itself does not require high temperature.

The third issue is that, the narrower the width of the organic pattern is, the steeper the side wall of the organic pattern becomes, or closer to an inverse-tapered shape the side wall becomes by the thermal reflow. As a result, taperization of the etched base film becomes difficult However, as described before, according to the present invention, the above three issues can be solved by implementing the taperization of organic mask with the dissolution reflow instead of thermal reflow. The reason will be described below.

Since a shape of reflowed part after the dissolution reflow does not depend on a width of organic pattern, a degree of taperization of organic mask after the dissolution reflow becomes uniform regardless of the width of the organic pattern. Then, the above first issue is not caused when the dissolution reflow is employed.

Described in the above, the taperization with the dissolution reflow accompanies increase in dimension in horizontal direction. When the organic solvent permeates into the organic pattern, a volume expansion of organic pattern takes place at the organic solvent permeated portion. A volume expansion of the organic pattern is also caused when the organic solvent is substantially permeated into the organic pattern so as to cause the dissolution reflow of the organic mask takes place. Therefore, the width of organic pattern increases by the dissolution reflow, and as a result, a distance between adjacent two patterns is shrunk by the dissolution reflow of the adjacent two patterns. When a base film is etched using the adjacent two patterns as masks, which are tapered by the dissolution reflow, a width of the etched base film becomes narrower than that of etched base film using the organic mask without the dissolution reflow. This means that implementation of the dissolution reflow contributes to minimization of a width of the etched base film pattern.

For example, when the etched base film pattern is used for wiring, implementation of the dissolution reflow of organic pattern contributes to minimization of the wire width. In addition, when a width of the organic pattern is over-expanded by the dissolution reflow, it is possible to decrease a little, that is, to adjust the expanded width by stopping the organic solvent permeation process in the later process, or by adding a heat treatment to this. Accordingly, the above second issue does not take place when the dissolution reflow is employed.

Even if a width of the organic pattern is narrow, the side wall of the organic pattern is tapered a little by the dissolution reflow, and the side wall does not approach to perpendicular, or does not become an inverse-tapered shape. Therefore, the etched base film can be tapered even if dry etching as well as wet etching is used from the above. Accordingly, the third issue does not happen.

[Surface Treatment]

As described, the degree of taperization of the organic mask after the dissolution reflow becomes uniform independent from a width of the organic pattern. To increase the uniformity, it is favorable to implement the reflow after increasing wettability of a part of the base film where is to be covered by the reflow of the organic pattern with a surface treatment. The surface treatment for increasing the wettability may be an oxygen plasma treatment or UV ozone treatment. These surface treatment improve the wettability of a surface of the base film where is not covered with the organic pattern. As a result, the dissolution reflowed organic pattern easily reflows on the surface of the base film. The oxygen plasma treatment and the UV ozone treatment are also effective to remove a deteriorated layer of organic pattern surface when the surface is deteriorated. The deteriorated layer may have a possibility to prevent the dissolution reflow. With the surface treatment, for example, with the oxygen plasma treatment or the UV ozone treatment, the deteriorated layer of organic pattern surface is removed as well as increasing the wettability of the base film. Accordingly, a uniform dissolution reflow with little difference between the surface and the inside of the organic pattern can be achieved.

In the dissolution reflow treatment, it is also possible to improve the wettability of the base by conducting surface treatment with a chemical solution for increasing the wettability of the base film portion.

In addition, it is also possible to make easy to permeate the organic solvent into the organic pattern by partially or entirely removing the deteriorated layer, or by introducing cracks in the deteriorated layer with a chemical solution treatment of the deteriorated layer of organic pattern surface. The essential point is to use a chemical solution which makes easy to permeate the organic solvent into the organic film without removing or peeling off the organic film by leaving the non-deteriorated portion as it is, and by selectively removing only the deteriorated layer or forming cracks in the deteriorated layer.

The deteriorated layer of the organic pattern is supposed to be caused by degradation with time, a thermal oxidation, a thermal hardening, an attachment of deposition film, an acid-based etching solution, $O_2$ ashing, and others such as chemical changes due to use of dry etching gas. Acid, alkaline solution and organic solvent mixed solution are used for the chemical solution. Specifically, the chemical solution is a solution mixed with amine-based organic solution. The amines may include monoethylamine, diethylamine, triethylamine, monoisopropylamine, diisopropylamine, monobutylamine, dibutylamine, tributylamine, hydroxylamine, diethylhydroxylamine, diethylhydroxylamine anhydride, pyridine, and picoline. In some case, a typical anti-etching material, for example, D-glucose ($C_6H_{12}O_6$), chelate agent, and antioxidant may be included in the chemical solution. A concentration of the amines mixed into the solution is in a range of 0.05~10 wt %. For removing a lightly deteriorated layer, that is, in the cases of degradation by, for example, with time, an acid-based etching, and isotropic $O_2$ ashing, the concentration may be the range of 0.05~3 wt %.

When only a wettability improvement of the base film is required, it is useful to implement the surface treatment by contacting the surface of the base film with hydrofluoric acid solution. A surface treatment with various kinds of plasma is also useful. A typical example of various kinds of plasma may include oxygen gas plasma ($O_2$ plasma), fluorine-based gas plasma (for example, SF6 gas plasma, CF4 gas plasma, CHF3 gas plasma) or mixed plasma of fluorine-based gas and oxygen gas (for example, SF6/O2 gas plasma, CF4/O2 gas plasma, CHF3/O2 gas plasma). Regarding the selection of method and condition of the surface treatment before the dissolution reflow, it is favorable to select them based on the measurement result of removal rate of the deteriorated organic pattern surface, according to the improvement level of wettability of the base film surface, where is to be covered with reflow, and a necessity. For example, the oxygen plasma treatment may be conducted under the conditions of O2 flow rate: 300 sccm, 100 Pa, PF power: 1000 W, and treatment time: 120 second. The UV ozone treatment may also be conducted under the conditions of substrate temperature: 100° C. to 200° C. in ozone gas atmosphere by irradiating UV light.

[Organic Film Forming an Organic Mask]

An organic pattern, that is, an organic film forming an organic mask may comprise at least one kind of organic material. There is not a limitation of the number of materials. Therefore, the organic pattern, that is, the organic film forming the organic mask may comprise at least one selected from an organic film made of organic material and an organic solvent added film. For example, the organic pattern may include a film formed on the base film with a printing method. The organic pattern may also include a resist pattern formed on the base film through the exposure and development processes. The resist may include photoresists which are photosensitive to ultra violet light, photosensitive to X-ray, and photosensitive to electron beam. There is not a limitation regarding a layer structure of the organic pattern. That is, the organic pattern may include a single structure of the organic film and a multi-structure which includes plural layers of the organic film. The resist film may be formed with one selected from a single structure of organic film, a plural structures of organic film, a single structure of organic solvent added film, a plural structures of organic solvent added film, and a plural structures of organic film and organic solvent added film. The organic film is substantially composed of organic-based material and organic solvent. On the other hand, the organic solvent added film is substantially consist of inorganic-based material and organic solvent.

A typical example of the organic-based material may include resin, for example, a well-known photoresist material, acrylic, polyimide, and polyacrylamide, and organic polymer materials. A typical example of the inorganic-based material may include siloxane, polysiloxane, polysilane, polycillin, carbosilane, silicon, and inorganic glass. A typical example of the organic solvent is as follows and all chemical solutions of the organic solvent may be usable.

Organic solvent (R: alkyl group, or substituted alkyl group, Ar: phenyl group, or aromatic ring except for phenyl group):
  alcohols (R—OH)
  alkoxyalcohols
  ethers (R—O—R, Ar—O—R, Ar—O—Ar)
  esters
  ketones
  glycols
  alkylene glycols
  glycol ethers The organic film may be composed of water soluble material. A typical example of the water soluble material may include one selected from a group of polyacrylic acid, polyvinyl acetal, polyvinyl pyrrolidone, polyvinyl alcohol, polyethylene imine, polyethylene oxide, styrene-maleic anhydride copolymer, polyvinylamine, polyallylamine, oxazoline group containing water soluble resin, water soluble melamine resin, water soluble urea resin, alkyd resin, and sulfonamide, or may include a mixture of two or more kinds of the above materials, or may include a material consisting of these salts as a main composition, or may include a material that an inorganic material is mixed with the materials described in the above.

When the organic film is substantially composed of organic material or inorganic material which are soluble in organic solvent, a solution of organic solvent is used as a chemical solution. On the other hand, when it is composed of water soluble organic solvent and organic material, or organic solvent and inorganic material, a solution at least containing water as a chemical solution may be used, thereby resulting in similar treatment effect to the above.

A typical example of kind of photoresist may be a photoresist sensitive to ultra violet light, a photoresist sensitive to X-ray, and a photoresist sensitive to electron beam, but not limited to the above. A photoresist like the following organic resist is favorable as a resist material. As an example of organic resist containing a polymer compound, a photosensitive agent, and some other addition agent, there is a resist composed of only organic material or of a mixture of organic material and inorganic material.

A typical example of resist composed of only organic material may include the followings, but not limited to those. An example of polyvinyl-based resist may be polyvinyl cinnamate ester. An example of rubber-based resist may include a mixture which mixes bisazide compound with cyclizing polyisoprene or cyclizing polybutadiene. An example of novolac resin-based resist may be a material mixing cresol novolac resin and naphthoquinone diazide-5-sulfonate ester. In addition, an example of copolymer resin-based resist of acrylate may be polyacrylamide and polyamic acid. Other example of resist may be a resist in which bromine or iodine is added, or a resist abundantly containing bromine or iodine.

On the other hand, an example of resist composed of a mixture of organic material and inorganic material may include a metal containing resist. An example of the metal containing resist may be siloxane, polysiloxane, polysilane, polycillin, and carbosilane. In addition, an example of resist containing metal other than silicon may be a germanium containing resist.

A resist-mask may be formed with either a nega-type resist or a posi-type resist. As the posi-type resist, a material mixing a novolac resin-based, for example, cresol novolac resin and naphthoquinone diazide-5-sulfonate is suitable for the resist. As the nega-type resist, a material mixing bisazide compound with a rubber-based, for example, cyclizing polyisoprene or cyclizing polybutadiene is suitable for it.

[Chemical Solution Containing Organic Solvent]

For causing the dissolution reflow of a resist film containing organic material, the resist film is contacted with organic solvent. A typical method of the contact is to expose the resist film to the vapor of organic solvent, or to dip the resist film into a diluted organic solvent, but not limited to these. The contact is sufficient if the surface of the resist film is contacted with the organic solvent for permeating the organic solvent into the inside of the film. Practically, either of exposure of the resist film to the vapor containing organic solvent, or dipping of the resist film into a diluted chemical solution may be possible.

A typical example of organic solvent contained in the chemical solution includes at least one selected from a group of following organic solvents.

Organic solvent (R: alkyl group, or substituted alkyl group, Ar: phenyl group, or aromatic ring except for phenyl group):
  alcohols (R—OH)
  alkoxyalcohols
  ethers (R—O—R, Ar—O—R, Ar—O—Ar)
  esters
  ketones
  glycols
  alkylene glycols
  glycol ethers

[Base Film]

There is not a limitation of the base film if it is patterned to have a taper shape with etching. The base film does not exclude to be composed of insulating material. However, the base film may be composed of electrically conductive film as a typical example needed in practice. A typical example of tapered base film pattern composed of electrically conductive film may be, for example, various kinds of electrode and wiring. A typical example of the various kinds of electrode may be, for example, a control electrode exemplified by a gate electrode, and a signal electrode and a bias electrode exemplified by a source electrode and drain electrode. The wirings extending on the substrate surface and at higher level than the substrate surface in the multi-layered wiring structure are both applicable. A typical example of the electrically conductive film as a base film may include the following metal film structures.

ITO film
Indium-Tin alloy
Single structure of Aluminum or Aluminum alloy
Single structure of Chromium or Chromium alloy
Double layer structure formed of Aluminum or Aluminum alloy layer and Chromium or Chromium alloy layer
Double layer structure formed of Aluminum or Aluminum alloy layer and Titanium or Titanium alloy layer
Double layer structure formed of Aluminum or Aluminum alloy layer and Titanium Nitride or Titanium Nitride alloy layer
Double layer structure formed of Aluminum or Aluminum alloy layer and Molybdenum or Molybdenum alloy layer
Double structure formed of Chromium or Chromium alloy layer and Molybdenum or Molybdenum alloy layer
Triple layer structure formed of Chromium or Chromium alloy layer at a first and a third layers and Aluminum or Aluminum alloy layer at a second layer
Triple layer structure formed of Molybdenum or Molybdenum alloy layer at a first and a third layers and Aluminum or Aluminum alloy layer at a second layer
Triple layer structure formed of Aluminum or Aluminum alloy layer, Molybdenum or Molybdenum alloy layer, and Chromium or Chromium alloy layer
Triple layer structure formed of Aluminum or Aluminum alloy layer, Molybdenum or Molybdenum alloy layer, and Titanium or Titanium alloy layer
Triple layer structure formed of Aluminum or Aluminum alloy layer, Titanium Nitride or Titanium Nitride alloy layer, and Titanium or Titanium alloy layer

[Wet Etching Solution]

A typical example of isotropic etching described in the above may be wet etching which uses etching solution. It is preferable to select the etching solution considering a material composing the base film which is to be etched, however, it is not necessary if selective etching of the base film is possible. Specifically, if the base film is substantially composed of chromium, an etching solution containing at least one of nitric acid and acetic acid may be used. For example, an etching solution mixing ceric ammonium nitrate and nitric acid is preferably used. In this case, the concentration of the nitric acid in the etching solution may be 0.3 mol/little or more. It is not necessary to contain 2 mol/little or more of the nitric acid which is used in the reference 2 (Japanese Laid-Open Patent Publication No. 7-7757). When an etching solution containing lower concentration of nitric acid is used, the taperization is still possible by using the dissolution reflow of the present invention. If the base film is substantially composed of aluminum or molybdenum, an etching solution containing at least one of phosphoric acid, nitric acid and acetic acid can be used. If the base film is substantially composed of metal nitride or metal oxide, an etching solution containing hydrofluoric acid can be used

[Isotropic Dry Etching]

A typical example of isotropic dry etching described in the above may be an etching for amorphous silicon. For example, conditions for the isotropic etching of amorphous silicon base film are as follows. (1) High frequency discharge power: 800 W, (2) Pressure in treatment: 30 Pa to 50 Pa, (3) Treatment gases and its flow rate: SF6/HCl/He=200/200/100 (sccm), (4)

Substrate temperature (substrate stage temperature): 25° C., (5) Treatment time: 120 seconds (Thickness of amorphous silicon: 200 nm).

[Anisotropic Dry Etching]

A typical example of anisotropic dry etching described in the above may be reactive ion etching. For example, conditions for anisotropic etching of the chromium base film are as follows. (1) High frequency discharge power: 1500 W, (2) Treatment pressure: 10 Pa to 20 Pa, (3) Treatment gases and its flow rate: Cl2/O2=300/200 (sccm), or Cl2/He/O2=300/100/200 (sccm), (4) Substrate temperature (substrate stage temperature): 25° C., (5) Treatment time: 100~200 seconds (Thickness of chromium film: 100 nm).

[Treatment or Removal of Deteriorated Layer of Resist]

If a resist mask surface is damaged, thereby deteriorated with a heat treatment, for example, with a post-bake, it is favorable to remove a deteriorated layer formed on the resist mask surface for the dissolution reflow in the later process. The process for removing the deteriorated layer of the resist mask surface is typically a plasma treatment or a UV ozone treatment. The plasma treatment may be conducted using one of a plasma treatment gases which contain oxygen, or fluorine gas, or a mixture of oxygen and fluorine gas. If the plasma treatment gas contains a fluorine-based gas, it contains one of SF6, CF4 and CHF3. When the plasma treatment gas contains a mixture of oxygen and fluorine gas, it contains one of SF6/O2, CF4/O2 and CHF3/O2.

In addition, instead of plasma treatment or UV ozone treatment, as described in the above, it is possible to make easy to permeate the organic solvent into the organic pattern by partially or entirely removing the deteriorated portion, or by introducing cracks in the deteriorated layer through a treatment of the deteriorated layer with a chemical solution. The essential point is to use a chemical solution which makes the organic solvent easy to permeate into the organic film without removing or peeling off the organic film by selectively removing only the deteriorated layer or introducing cracks in the deteriorated layer, while leaving the non-deteriorated portion as it is.

The deteriorated layer of the organic pattern is supposed to be caused by degradation with time, a thermal oxidation, a thermal hardening, an attachment of deposition film, an acid-based etching solution, $O_2$ ashing, and others such as chemical changes due to use of dry etching gas. Acid, alkaline solution and organic solvent mixed solution are used for the chemical solution. Specifically, the chemical solution is a solution mixed with amine-based organic solution. The amines may include monoethylamine, diethylamine, triethylamine, monoisopropylamine, diisopropylamine, monobutylamine, dibutylamine, tributylamine, hydroxylamine, diethylhydroxylamine, diethylhydroxylamine anhydride, pyridine, and picoline. In some case, a typical anti-etching material, for example, D-glucose ($C_6H_{12}O_6$), chelate agent, and antioxidant may be included in the chemical solution. A concentration of the amines mixed into the solution is in a range of 0.05~10 wt %. For removing a lightly deteriorated layer, that is, in the cases of degradation by, for example, with time, an acid-based etching, and isotropic $O_2$ ashing, the concentration may be the range of 0.05~3 wt %.

DETAILED DESCRIPTION OF THE PRESENT INVENTION

In addition to the explanation of the present invention described in the above, the present invention will be explained by referring to figures for specific understandings of the present invention.

[Organic Solvent Permeation Process Where the Dissolution Reflow Does Not Take Place, and a Change Mechanism of Shape and Dimension of Organic Pattern in Organic Solvent Evaporation Process in the Later Process]

Figure 1:
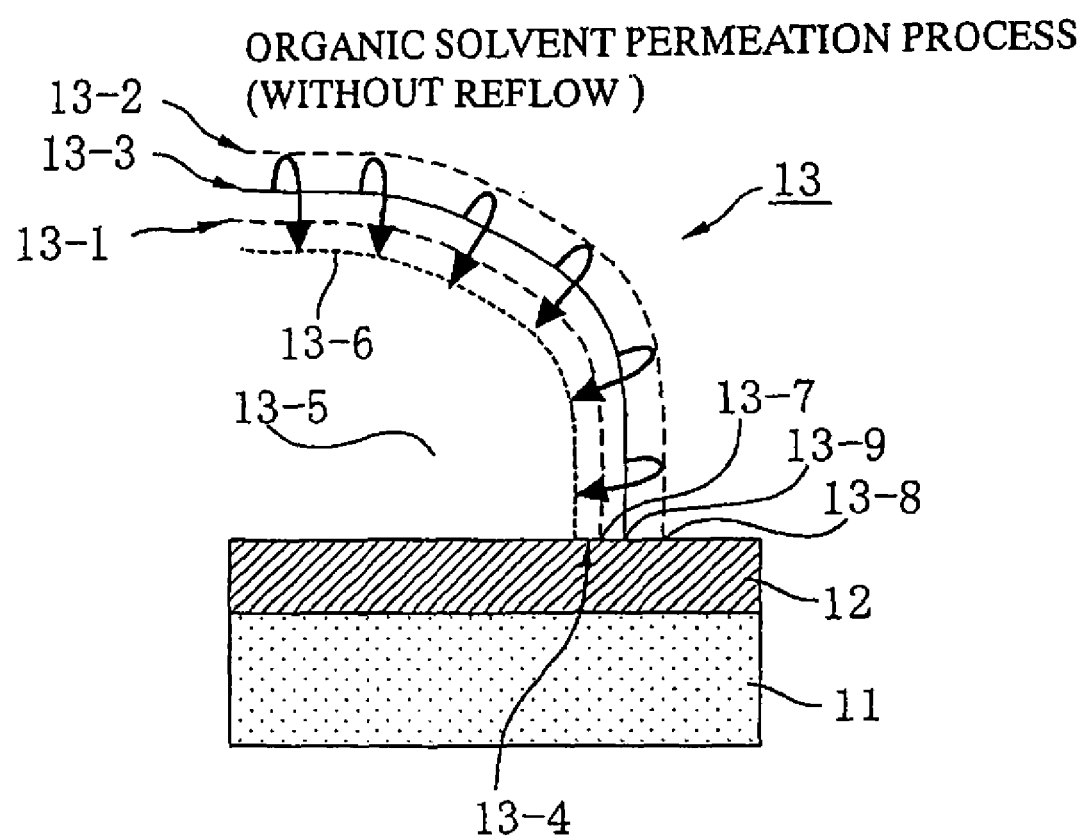
FIG. 1 is a partial traverse cross sectional view for explaining a process in which an organic pattern is contacted with a few organic solvent which is not sufficient to cause a dissolution reflow and a change mechanism of shape and dimension of the organic pattern at an evaporation process of the organic solvent in the later process.

FIG. 1 is a partial traverse cross sectional view for explaining a process in which the organic pattern is contacted to a few organic solvent which is not enough to cause the dissolution reflow and a change mechanism of shape and dimension of the organic pattern in evaporation process of organic solvent in the later process. Referring to FIG. 1, a process, in which the organic solvent is permeated into the organic pattern a few which is not enough to cause the dissolution reflow by contacting the organic pattern to the organic solvent, and the change mechanism of shape and dimension of the organic pattern in evaporation process of organic solvent in the later process will be explained. Base film 12, which is to be etched, is formed on substrate 11. Organic pattern 13 is formed on base film 12 with a well known method. After that, a post-bake is conducted at a temperature, which is higher than the minimum temperature for increasing the adhesion strength between the bottom of organic pattern 13 and base film 12, and also lower than a temperature causing a deterioration of organic pattern 13, which prevents permeation of the organic solvent into the organic pattern. Through this bake, the adhesion strength between the bottom of organic pattern 13 and base film 12 is increased. However, organic pattern 13 is not deteriorated and also a thermal reflow does not take place. The post-bake temperature depends on various conditions, for example, materials including the organic pattern. If the material of the organic pattern is a well known photoresist, a typical example of the temperature is lower than 150° C. For example, it may be possible to conduct a post-bake treatment at a temperature rage of 100° C. to 140° C.

As described before, for increasing the adhesion strength between the bottom of organic pattern 13 and base film 12, a pre-bake treatment before a patterning process may be conducted for increasing the adhesion strength between the organic film and base film 12 instead of the post-bake treatment, or adding to the post-bake treatment. A patterning of the organic film, as described in the above, may be implemented with an exposure process and a development process, or instead of these, may be conducted with a printing method. Organic pattern 13 is not expanded at this stage since it is not contacted to a chemical solution containing organic solvent. A partial traverse cross sectional view of organic pattern 13 before organic solvent treatment is shown with dotted line in FIG. 1 as organic pattern 13-1. The adhesion strength between the bottom of organic pattern 13 and base film 12 is increased at almost whole area of the bottom.

After that, by contacting organic pattern 13-1 to an organic solvent, the organic solvent gradually permeates with time from outside surface to the inside of organic pattern 13-1. Through the process where the organic solvent permeates into organic pattern 13-1, as described before, a volume expansion at a portion where the organic solvent has been permeated takes place. A partial traverse cross sectional view of organic pattern 13-1 when the volume is expanded due to permeation of organic solvent is shown in FIG. 1 with a dotted line as organic pattern 13-2. That is, organic pattern 13-1 becomes organic pattern 13-2 due to volume expansion by contacting with organic solvent. Organic pattern 13-2, expanded in volume, is consist of an organic solvent permeated portion 13-4, where organic solvent has been permeated, and an organic solvent non-permeated portion 13-5 where is inside of the organic solvent permeated portion 13-4. Border 13-6 of the organic solvent permeated portion 13-4 and the organic solvent non-permeated portion 13-5 is shown in FIG. 1 with a dotted line. That is, the organic solvent permeates to border 13-6, as a result, a volume expansion of organic solvent permeated portion 13-4, where is outside of border 13-6, takes place. On the other hand, the volume expansion does not take place at organic solvent non-permeated portion 13-5, where is inside of border 13-6.

As described before, the adhesion strength between the bottom of organic pattern 13 and base film 12 is decreased due to permeation of organic solvent into organic pattern 13. Practically, at the bottom of organic solvent permeated portion 13-4, where is outside of border 13-6, the adhesion strength with base film 12 is decreased. On the contrary, at the bottom of organic solvent non-permeated portion 13-5, where is inside of border 13-6, the adhesion strength with base film 12 is not decreased. Since the organic solvent permeates from the outside to the inside of organic pattern 13, border 13-6 between organic solvent permeated portion 13-4 and organic solvent non-permeated portion 13-5 is located at inside of the upmost surface position of organic pattern 13-1 before contacting with organic solvent. On the other hand, since the volume expansion takes place at organic solvent permeated portion 13-4, the upmost surface of volume expanded organic pattern 13-2 is located at outside of the upmost surface of organic pattern 13-1 before contacting with organic solvent. That is, side edge portion 13-8 of organic pattern 13-1, of which volume is expanded by contacting with organic solvent, is located at outside of side edge portion 13-7 of organic pattern 13-1 before contacting with organic solvent.

Before a permeation volume of organic solvent into pattern 13 reaches to a threshold volume to cause the dissolution reflow, a contact process of organic pattern 13 to the organic solvent is stopped. After stopping the contact to the organic solvent, a heat treatment for adjusting the adhesion strength within a range of the adhesion strength lower than that of the bottom of organic solvent non-permeated portion 13-5 is implemented for increasing the adhesion strength, which was once decreased, of the bottom of organic solvent permeated portion 13-4. A temperature range of the heat treatment for the adhesion strength adjustment is not limited. For example, it may be a range of 0° C. to 150° C. The optimum range may be 40° C. to 120° C. However, the purpose of the heat treatment for the adhesion strength adjustment is to increase the adhesion strength, once decreased, at the bottom of organic solvent permeated portion 13-4 of organic pattern 13, when a practically obtained taper angle of base film pattern 12 is over-tapered, thereby resulting in a smaller angle than a desired angle due to decrease of adhesion strength with base film 12 by permeation of the organic solvent. Therefore, when the desired taper angle is obtained due to decrease of the taper angle of practically obtained base film pattern 12 as a result of decrease of adhesion strength with base film 12 by permeation of the organic solvent, the heat treatment for adjusting the adhesion strength is not necessary.

With the heat treatment for adjusting the adhesion strength, an evaporation of organic solvent in organic solvent permeated portion 13-4 takes place. A natural evaporation of organic solvent in the organic solvent permeated portion 13-4 also takes place even if the heat treatment for the adhesion strength adjustment is not conducted. Due to the evaporation of organic solvent, a volume of organic solvent permeated portion 13-4 of organic pattern 13-2, which was once expanded, shrinks. A volume of the shrinkage is smaller than the advanced volume expansion. Therefore, the upmost surface of organic pattern 13-3 which has been shrunk after the organic solvent treatment is located at inside of that of organic pattern 13-2, of which volume was expanded by the organic solvent treatment, and at outside of that of organic pattern 13-1 before the organic solvent treatment. On the other hand, border 13-6 between organic solvent permeated portion 13-4 and organic solvent non-permeated portion 13-5 moves little, and is located at inside of the upmost surface of organic pattern 13 before the organic solvent treatment. Then, organic solvent permeated portion 13-4 finally remains at inside of organic pattern 13-3 even though the volume shrinks a little by the evaporation of organic solvent. Meaning of the word "organic solvent permeated portion" in the present invention includes both portions where organic solvent was permeated with organic solvent treatment and where organic solvent was once permeated and evaporated after that, that is, it includes both portions where organic solvent is being permeated at present and where organic solvent was permeated in the past.

Side edge 13-9 of the finally obtained organic pattern 13-3 after evaporation of organic solvent is located at inside of side edge 13-8 of organic pattern 13-2, of which volume was expanded by organic solvent treatment process, but still located at outside of side edge 13-7 of organic pattern 13-1 before the organic solvent treatment process. Therefore, the finally obtained organic pattern 13-3 is consist of organic solvent permeated portion 13-4 after evaporation of organic solvent and organic solvent non-permeated portion 13-5. The adhesion strength with base film 12 is decreased at the bottom of organic solvent permeated portion 13-4 where is at outside of border 13-6, on the other hand, that of at the bottom of organic solvent non-permeated portion 13-5 where is at inside of border 13-6 is not decreased. The finally obtained organic pattern 13-3 in the present invention is used as a mask for isotropic etching of base film 12 to taperize the etched base film pattern. In addition, for preventing from peeling off of organic mask in the etching process, it is important that the finally obtained organic pattern 13-3 has both of organic solvent non-permeated portion 13-5, where the adhesion strength with base film 12 is not decreased, and organic solvent permeated portion 13-4 where the adhesion strength with base film 12 is decreased. Using the finally obtained organic pattern 13-3 as the organic mask, isotropic etching for base film 12 is conducted.

[Organic Solvent Permeation Process Where a Dissolution Reflow Takes Place, and a Change Mechanism of Shape and Dimension of Organic Pattern in Organic Solvent Evaporation Process in the Later Process]

Figure 2:
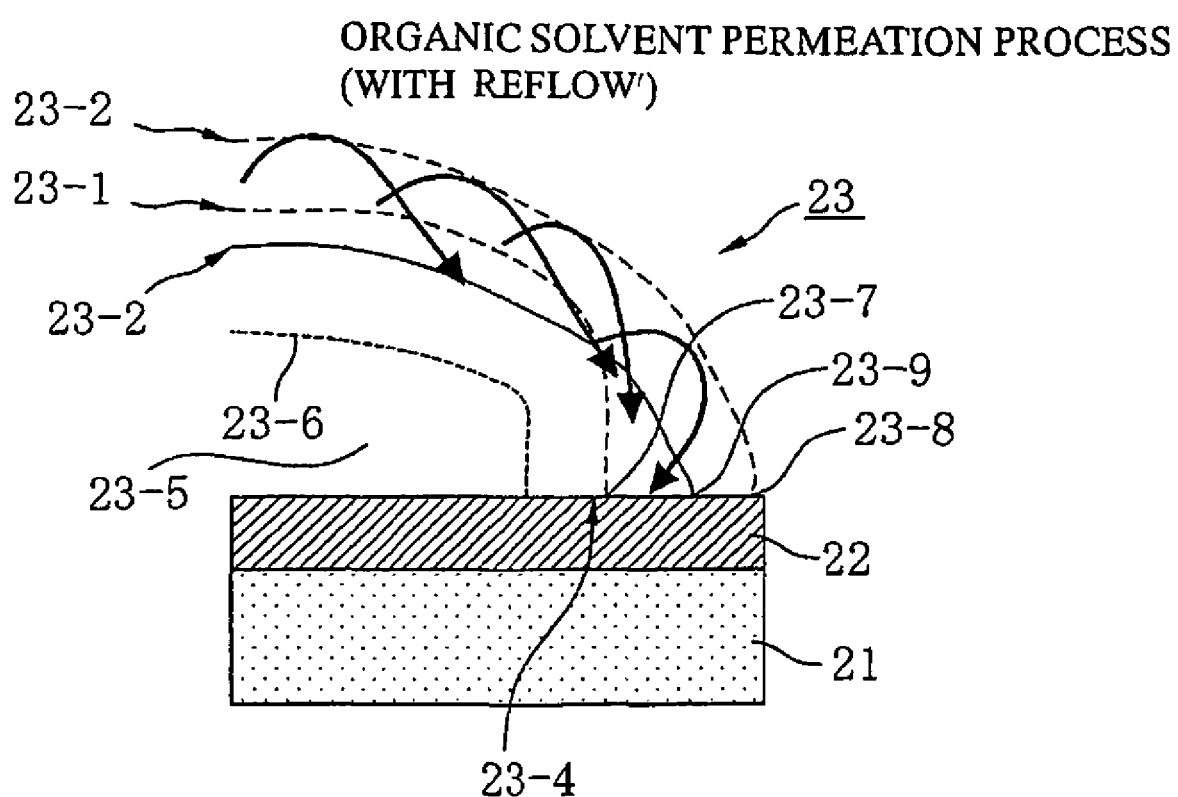
FIG. 2 is a partial traverse cross sectional view for explaining a process in which an organic pattern is contacted with substantial organic solvent which is sufficient to cause a dissolution reflow and a change mechanism of shape and dimension of organic pattern at an evaporation process of the organic solvent in the later process.

FIG. 2 is a partial traverse cross sectional view for explaining a process where the organic pattern is contacted to substantial organic solvent which is sufficient to cause the dissolution reflow and a change mechanism of shape and dimension of organic pattern in evaporation process of organic solvent in the later process.

Referring to FIG. 2, a process in which a substantial organic solvent sufficient to cause the dissolution reflow is permeated into organic pattern by contacting the organic pattern with organic solvent, and a change mechanism of shape and dimension of organic pattern at evaporation process of organic solvent in the later process will be explained. Base film 22, which is to be etched, is formed on substrate 21. After that, organic pattern 23 is formed on base film 22 with a well known method. Then, a post-bake is conducted at a temperature, which is higher than a minimum temperature for increasing the adhesion strength between the bottom of organic pattern 23 and base film 22, and also lower than a temperature causing a deterioration of organic pattern 23, which prevents the organic solvent to permeate into the organic pattern. Through this, the adhesion strength between the bottom of organic pattern 23 and base film 22 is increased. However, organic pattern 23 is not deteriorated and a thermal reflow does not take place. The post-bake temperature depends on various conditions, for example, materials including the organic pattern. If the material of the organic pattern is a well known photoresist, a typical example of the temperature is 150° C. or less. It may be possible to conduct the post-bake treatment, for example, at a temperature rage of 100° C. to 140° C.

As described before, for increasing the adhesion strength between the bottom of organic pattern 23 and base film 22, a pre-bake treatment before a patterning process may be conducted for increasing the adhesion strength between the organic film and base film 12 instead of the post-bake, or adding to the post-bake treatment. A patterning of the organic film may be implemented with the exposure process and the development process as described in the above, or instead of these, may be conducted with a printing method. At this stage, organic pattern 23 is not expanded since it is not contacted with a chemical solution containing organic solvent. A partial traverse cross sectional view of organic pattern 23 before the organic solvent treatment is shown in FIG. 2 with dotted line as organic pattern 23-1. The adhesion strength between the bottom of organic pattern 23 and base film 22 has been increased at almost whole area of the bottom.

After that, by contacting organic pattern 23-1 with an organic solvent, the organic solvent gradually permeates with time from outside surface to inside of organic pattern 23-1. Through the process where the organic solvent permeates into organic pattern 23-1, as described before, a volume expansion takes place at a portion where the organic solvent has been permeated. The contact process with the organic solvent is continued until a permeation volume of organic solvent into organic pattern 23 becomes more than a threshold volume to cause the dissolution reflow, and the dissolution reflow of organic pattern 23 practically takes place. Until the permeation volume into organic pattern 23 reaches to the threshold volume to cause the dissolution reflow, only a volume expansion takes place at the portion where organic solvent has been permeated. However, if the permeation volume of organic solvent exceeds the threshold volume, the dissolution reflow takes place as well as the volume expansion at the portion where organic solvent has been permeated.

A partial traverse cross sectional view of organic pattern 23 at volume expansion and dissolution reflow by organic solvent permeation is shown in FIG. 2 with a dotted line as organic pattern 23-2. That is, organic pattern 23-1 becomes organic pattern 23-2 due to volume expansion and dissolution reflow by contacting with organic solvent. Organic pattern 23-2, which was expanded and dissolution reflowed, is consist of organic solvent permeated portion 23-4 where organic solvent has been permeated and organic solvent non-permeated portion 23-5 where is at inside of the organic solvent permeated portion 23-4. A viscosity of organics solvent permeated portion 23-4 is substantially lowered, thereby resulting in reflow at a part of the portion 23-4 by dissolution. That is, organic solvent permeated portion 23-4 includes two portions where only volume expansion takes place by organic solvent permeation without reflow, and where volume expansion and reflow take place by organic solvent permeation. Since a viscosity near to the surface of organic pattern 23 of organics solvent permeated portion is likely to be lowered earlier and larger than that of farther portion from the surface of organic pattern 23 of organics solvent permeated portion in general, the dissolution reflow starts from a portion near to the surface of organics solvent permeated portion.

Because the dissolution reflowed organic material flows out along a sloped side wall of organic pattern 23, as shown in FIG. 2, an increase in dimension in horizontal direction is larger than that of thickness, that is, a height of organic pattern 23, due to the dissolution reflow. According to increase of dissolution reflow volume, an increase of thickness, that is, the height of organic pattern 23, becomes small. On the other hand, the increase of dimension in horizontal direction of organic pattern 23 becomes large. If the dissolution reflow volume is further increased, the increase of thickness, that is, the height of organic pattern 23 becomes few, or the thickness is decreased a few. On the contrary, the increase of dimension in horizontal direction of organic pattern 23 becomes substantially large. Border 23-6 of organic solvent permeated portion 23-4 and organic solvent non-permeated portion 23-5 is shown in FIG. 2 with a dotted line. That is, the organic solvent permeates to border 13-6, and as a result, the volume expansion and the dissolution reflow of organic solvent permeated portion 23-4, where is at outside of border 23-6, take place. On the other hand, the volume expansion and the dissolution reflow are not caused at organic solvent non-permeated portion 23-5, where is at inside of border 23-6.

As described in the above, the adhesion strength between the bottom of organic pattern 23 and base film 22 is decreased due to permeation of organic solvent into organic pattern 23. Organic solvent permeated portion 23-4 where is at outside of border 23-6 includes two portions where only volume expansion takes place by organic solvent permeation without reflow, and where volume expansion and reflow take place by organic solvent permeation. At the bottom of organic solvent permeated portion 23-4, the adhesion strength with base film 22 is decreased. On the contrary, at the bottom of organic solvent non-permeated portion 23-5, where is at inside of border 23-6, the adhesion strength with base film 22 is not decreased. In addition, since the organic solvent permeates from the outside to the inside of organic pattern 23, border 23-6 between organic solvent permeated portion 23-4 and organic solvent non-permeated portion 23-5 is located at inside of the upmost surface position of organic pattern 23-1 before contacting with organic solvent.

On the other hand, organic solvent permeated portion 23-4 where organic solvent is permeated includes two portions where only volume expansion takes place by organic solvent permeation without reflow, and where volume expansion and reflow take place by organic solvent permeation. A side edge portion 23-8 of organic pattern 23-2, which is expanded and dissolution reflowed by permeation of organic solvent, is located at outside of side edge portion 23-7 of organic pattern 23-1 before contacting with organic solvent. If the dissolution reflow is not substantially large, as shown in FIG. 2, the upmost surface of the expanded and dissolution reflowed organic pattern 23-2 is located at outside of that of organic pattern 23-1 before contacting with organic solvent.

After that, a process to contact organic pattern 23 with organic solvent is stopped. After stopping the contact with organic solvent, a heat treatment of adhesion strength adjustment for increasing the adhesion strength, which was once decreased, at the bottom of organic solvent permeated portion 23-4 is conducted within a range of adhesion strength lower than that of the bottom of organic solvent non-permeated portion 23-5. A temperature range of the heat treatment for the adhesion strength adjustment is not limited. It may be, for example, a range of 0° C. to 150° C. Optimally, it may be 40° C. to 120° C. However, the purpose of the heat treatment of adhesion strength adjustment is to increase the adhesion strength, once decreased, at the bottom of organic solvent permeated portion 23-4 of organic pattern 23, when a practically obtained taper angle of base film pattern 22 is over-tapered, thereby resulting in a smaller angle than a desired angle due to decrease of adhesion strength with base film 22 by permeation of the organic solvent. Therefore, when the desired taper angle is obtained due to decrease of taper angle of practically obtained base film pattern 22, as a result of decrease in adhesion strength with base film 22 by permeation of organic solvent, the heat treatment for adjusting the adhesion strength is not necessary.

An evaporation of organic solvent in organic solvent permeated portion 23-4 takes place by the heat treatment for the adhesion strength adjustment. A natural evaporation of organic solvent in the organic solvent permeated portion 23-4 also takes place even if the heat treatment for the adhesion strength adjustment is not conducted. Due to the evaporation of organic solvent, a volume of organic solvent permeated portion 23-4 of organic pattern 23-2, once expanded, shrinks. A volume of the shrinkage is smaller than the advanced volume expansion. Therefore, the upmost surface of organic pattern 23-3 which has shrunk after the organic solvent treatment is located at inside of that of organic pattern 23-2 of which volume was expanded and dissolution reflowed by the organic solvent treatment, and at outside of that of organic pattern 23-1 before the organic solvent treatment. However, an upper portion of organic pattern 23 is flown down at a side edge along the sloped wall by the dissolution reflow with organic solvent treatment, a height of organic pattern 23-3 which has shrunk after the organic solvent treatment becomes lower than that of organic pattern 23-1 before the organic solvent treatment as shown in FIG. 2 in some case.

If the volume of the dissolution reflow is not substantially large, the height of organic pattern 23-3, which has shrunk after the organic solvent treatment, may become a little higher than that of organic pattern 23-1 before the organic solvent treatment in some case. However, even in this case, the difference of dimension in horizontal direction between organic pattern 23-3, which has shrunk after the organic solvent treatment, and organic pattern 23-1 before the organic solvent treatment is larger than that of the height between them. On the other hand, border 23-6 between organic solvent permeated portion 23-4 and organic solvent non-permeated portion 23-5 moves few, and is located at inside of the upmost surface of organic pattern 23-1 before the organic solvent treatment. Therefore, organic solvent permeated portion 23-4 finally remains at inside of organic pattern 23-3 even though the volume shrinks a few by natural evaporation of organic solvent.

Side edge 23-9 of the finally obtained organic pattern 23-3 after evaporation of organic solvent is located at inside of side edge 23-8 of organic pattern 23-2 of which volume was expanded by organic solvent treatment process, but still located at outside of side edge 23-7 of organic pattern 23-1 before the organic solvent treatment process. Therefore, the finally obtained organic pattern 23-3 is composed of organic solvent permeated portion 23-4 after evaporation of organic solvent and organic solvent non-permeated portion 23-5. Organic solvent permeated portion 23-4 includes, as described in the above, a dissolution reflowed portion. The adhesion strength with base film 22 is decreased at the bottom of organic solvent permeated portion 23-4, where is at outside of border 23-6, on the other hand, that of at the bottom of organic solvent non-permeated portion 23-5, where is at inside of border 23-6 is not decreased. An adhesion strength between base film 22 and the dissolution reflowed portion flown down by the dissolution reflow from a part of organic solvent permeated portion 23-4 on an exposed surface of base film 22 located at the periphery of organic pattern 23 is substantially low.

The finally obtained organic pattern 23-3 in the present invention is used as a mask for isotropic etching of base film 22 to taperize the etched base film pattern. In addition, for preventing from peeling off of organic mask in the etching process, it is important that the finally obtained organic pattern 23-3 includes both of organic solvent non-permeated portion 23-5, where the adhesion strength with base film 22 is not decreased, and organic solvent permeated portion 23-4 where the adhesion strength with base film 22 is decreased. Using the finally obtained organic pattern 23-3 as the organic mask, isotropic etching for base film 12 is conducted.

It is important that the finally obtained organic pattern 23-3 has a tapered shape in the present invention for taperizing the etched base film pattern by anisotoropically etching the base film 22 using the finally obtained organic pattern 23-3 as an organic mask. In this case, as described in the above, the purpose of the heat treatment after stopping contact with organic solvent is to increase the taper angle, not to increase the adhesion strength, once decreased, at the bottom of organic solvent permeated portion 23-4.

In addition, as described before, it is preferable to implement a surface treatment on an exposed surface of base film 22 located at around organic pattern 23-1 before contacting organic pattern 23 with organic solvent for improving wettability of the exposed surface of base film 22. The surface treatment is the same with that of described before. Then, duplication of the explanation will be avoided here.

[A Mechanism of Isotropic Etching Accompanied Taperization of Base Film]

Figure 3:
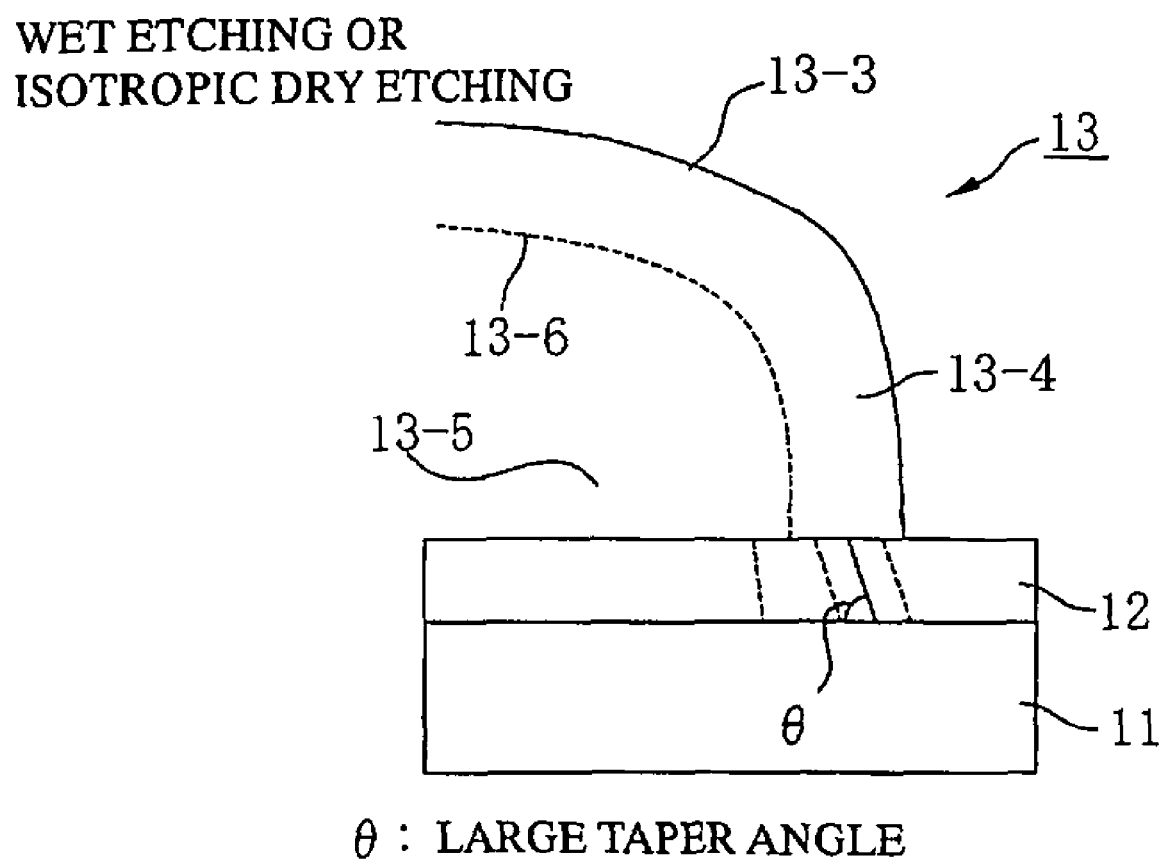
FIG. 3 is a partial traverse cross sectional view showing a mechanism of isotropic etching of a base film accompanying taperization using a finally obtained organic mask shown in FIG. 1.

Next, a mechanism of base film etching, which is accompanied a taperization of base film, using an organic mask finally obtained through a treatment explained by referring to FIG. 1 and FIG. 2 will be described by referring to figures. FIG. 3 is a partial traverse cross sectional view showing the mechanism of isotropic etching of the base film, which is accompanied the taperization, using the finally obtained organic mask shown in FIG. 1. As described before, organic pattern 13-3 which is finally obtained with the treatment shown in FIG. 1 is consist of organic solvent permeated portion 13-4 after evaporation of organic solvent and organic solvent non-permeated portion 13-5. The adhesion strength with base film 12 is decreased at the bottom of organic solvent permeated portion 13-4, where is at outside of border 13-6, on the other hand, that of at the bottom of organic solvent non-permeated portion 13-5 where is at inside of border 13-6 is not decreased. Using the finally obtained organic pattern 13-3 as an organic mask, isotropic etching of base film 12 is conducted.

With isotropic etching, exemplified by wet etching, which is a typical isotropic etching, the reason, why a decrease in adhesion strength at the bottom of organic solvent permeated portion 13-4 with base film 12 contributes to the taperization of etched base film 12, will be explained in the following. This is applicable to other isotropic etching such as isotropic dry etching. As described, base film 12, which is to be etched, has strong adhesion strength with substrate 11 of a base structure directly below the base film 12, and also with the bottom of organic solvent non-permeated portion 13-5 of organic mask 13-3 immediately above the base film 12. Therefore, when substrate 11 is dipped in an etching solution for etching the base film 12, the etching solution penetrates easier into an interface between base film 12 and the bottom of organic solvent permeated portion 13-4, where the adhesion strength is low compared with that of between base film 12 and the substrate 11, where the adhesion strength is high. Then, an etching speed in horizontal inside direction at an upper portion of base film 12 adjacent to the bottom of organic solvent permeated portion 13-4 is faster than that of bottom portion of base film 12 adjacent to the substrate 11. As a result, a permeation of etching solution into the interface, where the adhesion strength is low, is promoted when an etching position in horizontal direction of the upper portion of base film 12 is located below the bottom of organic solvent permeated portion 13-4 of organic mask 13-3. Accordingly, the etching speeds at the upper portion and the bottom portion of base film 12 become different. As a result, an etching surface of base film 12 is tapered and normal taperization of the film 12 is promoted.

When the etching position in horizontal direction at the upper portion of base film 12 is located below the bottom of organic solvent non-permeated portion 13-5 where is at inside of border 13-6 of organic mask 13-3, the permeation of etching solution into the interface, where the adhesion strength is high due to high adhesion strength between base film 12 and the bottom of organic solvent non-permeated portion 13-5, is not promoted. Therefore, the difference of etching speeds in horizontal direction between the upper and the bottom portions becomes little. As a result, a slope of etching surface of base film 12 gradually reaches to perpendicular, thereby resulting in recession of normal taperization. Then, it is essential to stop the etching process before the etching position at the upper portion of base film 12 in horizontal direction exceeds border 13-6 of organic mask 13-3. In other words, it is preferable to continue the contact process of organic pattern 13 with organic solvent until the organic solvent permeates beyond a predetermined final etching position at the bottom of organic pattern 13.

As described before, since the adhesion strength between base film 12 and the bottom of organic solvent permeated portion 13-4 of organic mask 13-3 is adjusted by the heat treatment which is implemented after the organic solvent treatment process, the finally obtained taper angle of base film 12 through isotropic etching becomes a desired angle.

Figure 4:
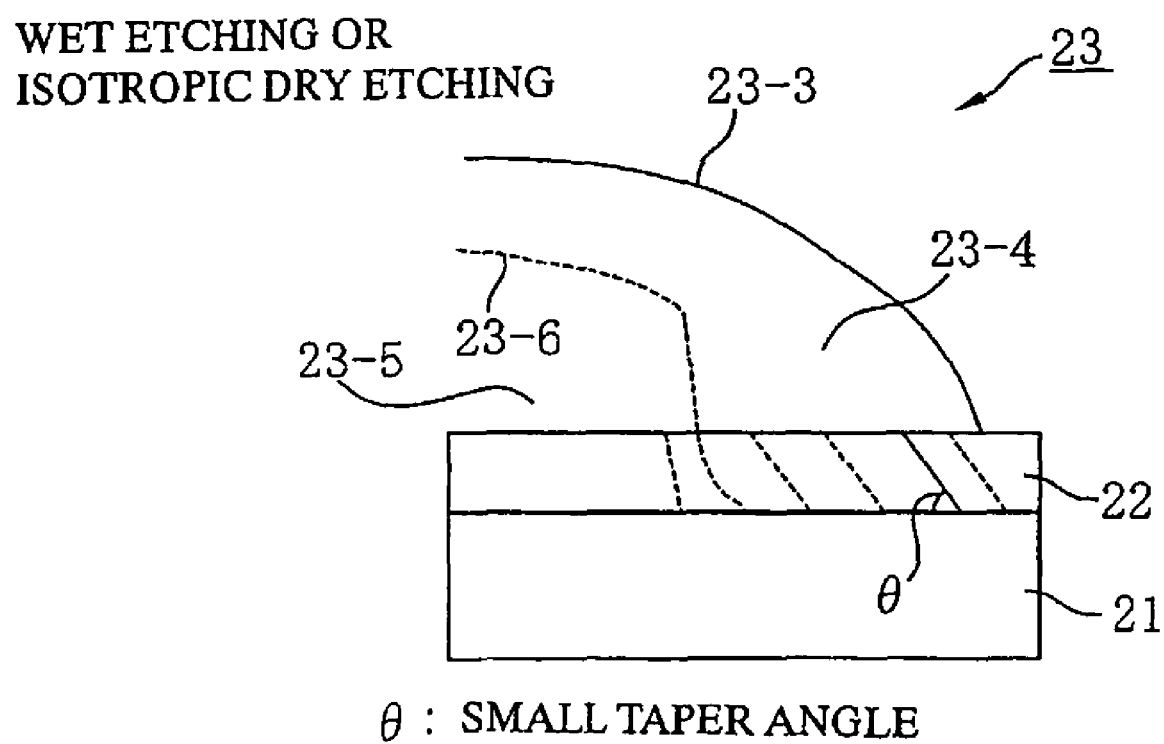
FIG. 4 is a partial traverse cross sectional view showing a mechanism of isotropic etching of a base film accompanying taperization using an organic mask finally obtained through a treatment process shown in FIG. 2.

FIG. 4 is a partial traverse cross sectional view showing a mechanism of isotropic etching of base film, which is accompanied taperization, using an organic mask finally obtained through the treatment process in FIG. 2. The finally obtained organic mask 23-3 obtained through the treatment process shown in FIG. 2 is consist of organic solvent permeated portion 23-4 after evaporation of organic solvent and organic solvent non-permeated portion 23-5. As described before, organic solvent permeated portion 23-4 includes dissolution reflowed portion. The adhesion strength with base film 22 is decreased at the bottom of organic solvent permeated portion 23-4 where is at outside of border 23-6. On the other hand, at the bottom of organic solvent non-permeated portion 23-5 where is at inside of border 23-6, the adhesion strength with base film 22 is not decreased. The adhesion strength at the bottom of dissolution reflowed portion flown down by the dissolution reflow of organic solvent permeated portion 23-4 on the exposed surface of base film 22 located around the periphery of organic pattern 23 is substantially low. Using the finally obtained organic pattern 23-3 as an organic mask, isotropic etching for base film 22 is conducted.

Using wet etching as an example, which is a typical isotropic etching, the reason why a decrease in adhesion strength at the bottom of organic solvent permeated portion 23-4 with base film 22 contributes to the taperization of etched base film 22 will be explained in the following. As described before, base film 22, which is to be etched, has strong adhesion strength with substrate 21 of a base structure directly below the base film 22, and also with the bottom of organic solvent non-permeated portion 23-5 of organic mask 23-3 immediately above the base film 22. On the other hand, it has low adhesion strength with the bottom of organic solvent permeated portion 23-4 of organic mask 23-3 immediately above base film 22. Therefore, when substrate 21 is dipped in an etching solution for etching the base film 22, the etching solution penetrates easier into an interface between base film 22 and the bottom of organic solvent permeated portion 23-4 where the adhesion strength is low compared with that of between base film 22 and the substrate 21 where the adhesion strength is high. Therefore, an etching speed in horizontal inside direction at an upper portion of base film 22 adjacent to the bottom of organic solvent permeated portion 23-4 is faster than that of a bottom portion of base film 22 adjacent to the substrate 21. As a result, a permeation of etching solution into the interface where the adhesion strength is low is promoted when an etching position in horizontal direction of the upper portion of base film 22 is located below the bottom of organic solvent permeated portion 23-4 of organic mask 23-3. Accordingly, the etching speeds at the upper portion and at the bottom portion of base film 22 become different, resulting in tapered etching surface and promotion of normal taperization.

When the etching position in horizontal direction of the upper portion of base film 22 is located below the bottom of organic solvent non-permeated portion 23-5 where is at inside of border 23-6 of organic mask 23-3, the permeation of etching solution into the interface, where the adhesion strength is high due to high adhesion strength between base film 22 and the bottom of organic solvent non-permeated portion 23-5, is not promoted. Therefore, the difference of etching speed in horizontal inside direction between the upper and bottom portions of base film 22 becomes few. As a result, a slope of etching surface of base film 22 gradually reaches to perpendicular, thereby resulting in recession of normal taperization. Therefore, it is important to stop the etching process before the etching position at the upper portion of base film 22 in horizontal direction exceeds border 23-6 of organic mask 23-3. In other words, it is preferable to continue the contact process of organic pattern 23 with organic solvent until the organic solvent permeates beyond a predetermined final etching position of the bottom of organic pattern 23.

As described before, since the adhesion strength between base film 22 and the bottom of organic solvent permeated portion 23-4 of organic mask 23-3 is adjusted by the heat treatment implemented after the organic solvent treatment process, the finally obtained taper angle of base film 22 becomes a desired angle through isotropic etching.

Since the finally obtained organic mask through the treatment shown in FIG. 1 is not tapered, the organic mask can be used only for isotropic etching. However, the finally obtained organic mask through the treatment shown in FIG. 2 is tapered, the organic mask can be used for anisotropic etching as well as isotropic etching.

[A Mechanism of Anisotropic Etching of Base Film Accompanied Taperization]

Figure 5:
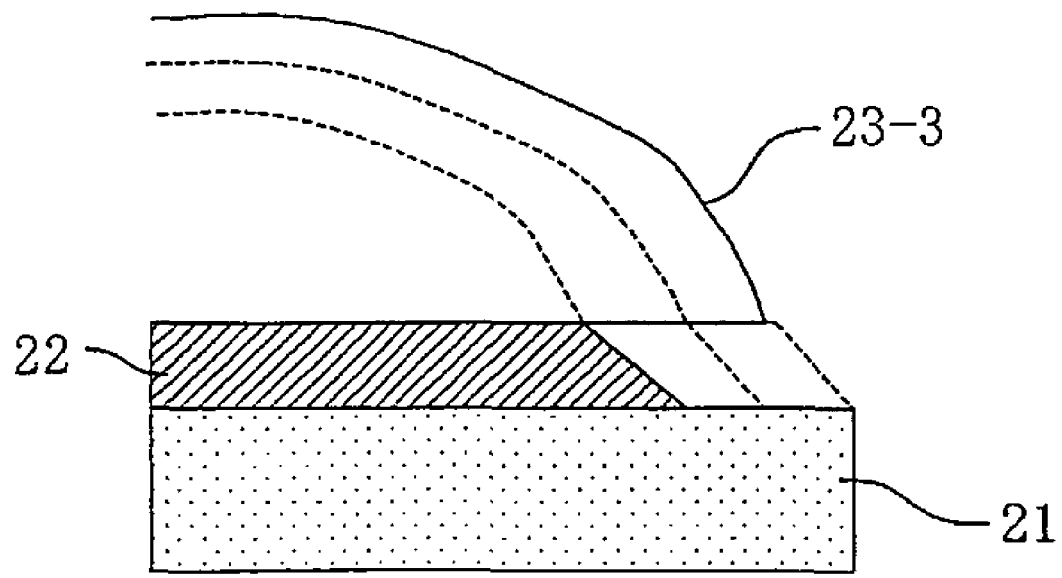
FIG. 5 is a partial traverse cross sectional view showing a mechanism of anisotropic etching of a base film accompanying taperization using an organic mask finally obtained through a treatment process shown in FIG. 2.

FIG. 5 is a partial traverse cross sectional view showing a mechanism of anisotropic etching of base film, which is accompanied taperization, using an organic mask which is finally obtained through the treatment process in FIG. 2. As described before, the finally obtained organic mask 23-3, which is obtained through the treatment process shown in FIG. 2, is consist of organic solvent permeated portion 23-4 after evaporation of organic solvent and organic solvent non-permeated portion 23-5. Organic solvent permeated portion 23-4, as described before, includes a dissolution reflowed portion. Using the finally obtained organic pattern 23-3, which is tapered, as an organic mask, anisotropic etching for base film 22 is conducted.

When the base film is etched through anisotoropic etching, a taper shape of organic mask 23-3 substantially contributes to the taperization of etched base film 22. This is different from isotropic etching described in the above. Dry etching has a stronger tendency of anisotropy than wet etching in general. For example, reactive ion etching is exemplified as a typical example of dry etching. In etching process, the organic mask is also etched as well as the base film, which is an etching target. That is, since an exposed surface of organic mask 23-3 is etched by etching particles, the periphery of tapered organic mask 23-3 recedes toward the center of the organic mask. According to the recession of the tapered periphery of organic mask 23-3 toward the center of the organic mask, a new portion of base film 22 where has been covered with organic mask 23-3 appears. When the new portion has appeared by the recession of the tapered periphery of organic mask 23-3, etching for the newly exposed portion of base film 22 starts due to exposure to the etching particles. The recession of the tapered periphery portion of organic mask 23-3 proceed from the outside to the inside with time. Then, the exposed portion of base film 22 expands from the outside to the inside with time. Therefore, etching of the outer portion of exposed base film starts at earlier timing than that of the inner portion due to earlier exposure to the etching particles. As a result, the outer exposed portion is exposed longer time to the etching particles than the inner exposed portion, that is, the outer exposed portion is etched deeper. Accordingly, the etching surface of base film 22 is tapered, and the etched base film 22 has a taper shape.

In addition, the more the side wall slope of organic mask 23-3 is gentle, that is, the smaller the taper angle of organic mask 23-3 is, the faster the recession speed of the tapered periphery portion of the organic mask with anisotropic etching becomes. If the recession speed is fast, a slope of etching surface of etched base film 22 becomes gentle. As a result, a taper of the etched base film becomes small. Accordingly, a substantially tapered base film pattern can be obtained. Therefore, when a small tapered angle of etched base film 22 is required in anisotropic etching, the taper angle of organic mask 23-3 must be formed small. On the other hand, when a large tapered angle of etched base film 22 is required in anisotropic etching, the taper angle of organic mask 23-3 must be formed large. For achieving the above, it is necessary to cause increase of the taper angle accompanying to the volume shrinkage of organic pattern 23-3 by conducting a heat treatment for adjusting the taper angle of organic mask after once dissolution reflowed. That is, for adjusting a taper angle of etched base film 22 in anisotropic etching, it is necessary to conduct the heat treatment after the dissolution reflow according to the necessity as well as for adjusting a volume of dissolution reflow. This heat treatment is the same with that of explained before as the heat treatment for the taper angle adjustment.

Figure 6:
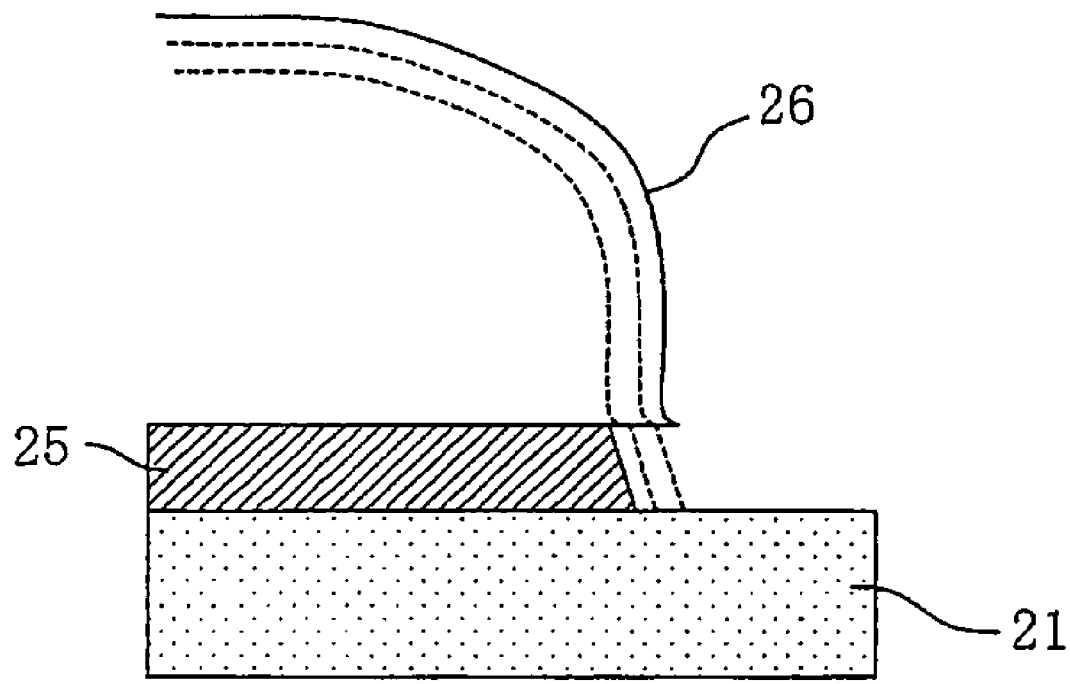
FIG. 6 is a partial traverse cross sectional view showing a mechanism of anisotropic etching of a base film using an organic mask which is not tapered and obtained with only patterning of organic film without treatments shown in FIG. 1 and FIG. 2.

As an example of the present invention for comparison, FIG. 6 is a partial traverse cross sectional view showing a mechanism of anisotropic etching of the base film without treatments shown in FIG. 1 and FIG. 2 using an organic mask which is not tapered and obtained with only a patterning of the organic film. Since the periphery portion of organic mask 26 is not tapered, the exposed surface of organic mask 26 is etched with etching particles. However, the recession speed of the periphery portion toward the center of organic mask is substantially slow compared with the tapered case described before. Therefore, an expanding speed of the exposed portion of base film 25 is also substantially slowed. As a result, the etching surface of base film 25 becomes close to perpendicular. Accordingly, the etched base film 25 has not a tapered shape.

First Embodiment

[Organic pattern formation+Post-bake+Chemical solution treatment (with dissolution reflow)+Adhesion strength adjustment treatment+Wet etching]

A first embodiment of the present invention will be explained below. FIG. 7A to FIG. 7E are partial traverse cross sectional views showing a method of wet etching according to the first embodiment of the present invention. FIG. 8 is a figure showing a relation between a taper angle of base film pattern and temperature for a re-bake treatment when a time for the re-bake treatment before the wet etching is fixed.

Figure 7A:
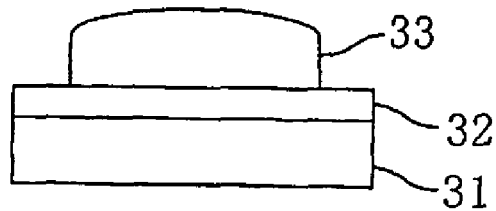
FIG. 7A is a partial traverse cross sectional view showing a method of wet etching according to the first embodiment of the present invention.
Figure 8:
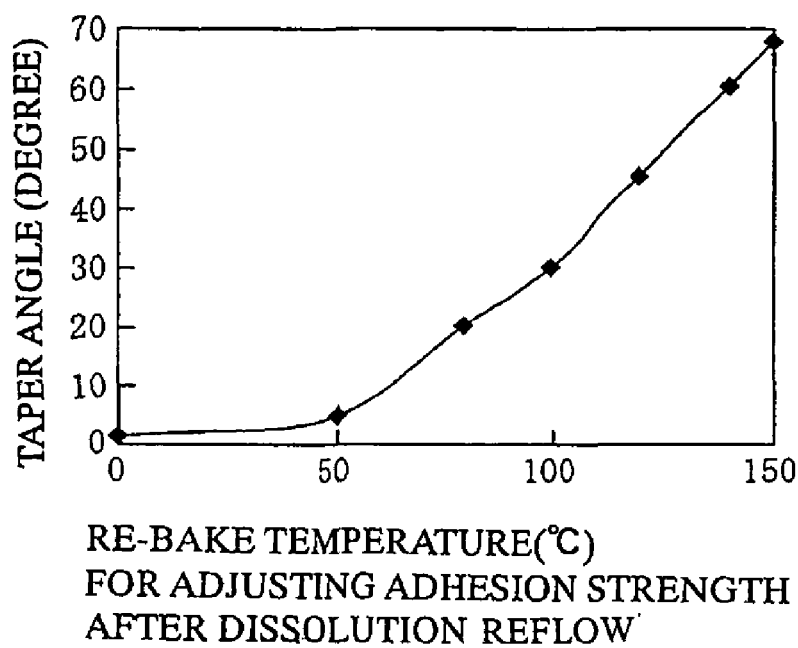
FIG. 8 shows a relation between a taper angle of base film pattern and temperature when time for a re-bake treatment implemented before wet etching.

As shown in FIG. 7A, chromium film 32 is formed on insulating substrate 31. A thickness of chromium film 32 is about 1 μm. Resist pattern 33 is formed on a predetermined area on chromium film 32 using a well known photolithography technology. A base structure of chromium film 32 is insulating substrate 31 in this case. However, the insulating substrate may be, for example, a transparent substrate such as glass for a liquid crystal display unit, amorphous silicon, silicon oxide, silicon nitride, and silicon oxide and silicon nitride for a semiconductor integral circuit.

Figure 7B:
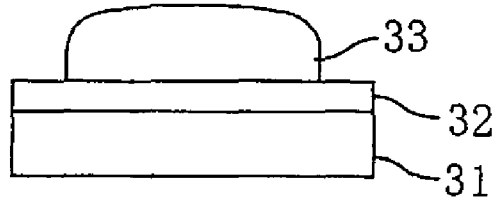
FIG. 7B is a partial traverse cross sectional view showing a method of wet etching according to the first embodiment of the present invention.

As shown in FIG. 7B, the post-bake treatment has been conducted for the purpose of increasing an adhesion strength between resist pattern 33 and chromium film 32. A temperature range of 0° C. to 150° C. is effective for the post-bake treatment. However, the post-bake treatment was conducted at temperature range of 100° C. to 140° C. in this embodiment. A thermal reflow of resist pattern 33 has not caused by the post-bake treatment with this temperature range.

Figure 7C:
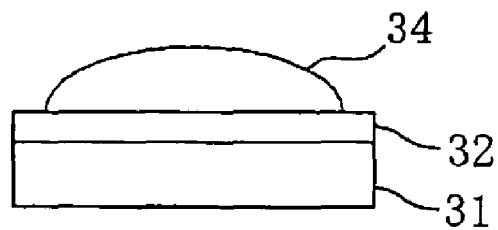
FIG. 7C is a partial traverse cross sectional view showing a method of wet etching according to the first embodiment of the present invention.

As shown FIG. 7C, resist pattern 33 has been contacted with a chemical solution containing organic solvent. Resist pattern 33 may be exposed to a vapor of the chemical solution or may be dipped in the chemical solution having substantially diluted concentration. Specifically, when resist pattern 33 is exposed to a vapor of chemical solution at room temperature (around 20° C.) using acetone or propylene glycol monoethyl ether which have high density vapor, the treatment time is 0.1 to 3 minutes. On the other hand, when resist pattern 33 is exposed to a vapor of chemical solution at room temperature (around 20° C.) using tripropylene glycol monoethyl ether or N-methyl-2-pyrrolidone which have low density vapor, the treatment time is 5 to 20 minutes. When temperatures of the organic solvent and the substrate are high, or according to increase of substrate temperature relative to that of organic solvent, an exposure time to the vapor of chemical solution for causing the dissolution reflow becomes long. On the other hand, when the temperatures of the organic solvent and the substrate are low, the exposure time to the vapor of chemical solution for causing the dissolution reflow becomes short. In the dipping treatment into an organic solvent solution which has substantially diluted concentration, if the concentration of organic solvent is high, the resist dissolves into organic solvent, and a peeling off of resist is caused. Therefore, the concentration of organic solvent in the solution must be adjusted so as to not to cause the dissolution peeling off, as well as to permeate a part of organic solvent into the resist.

In the present embodiment, acetone, propylene glycol monoethyl ether, tripropylene glycol monoethyl ether, and N-methyl-2-pyrrolidone are used as organic solvents. However, if at least one selected from a group shown below is used as the organic solvent, it is applicable as a modification of the present embodiment, and this is also true for the other embodiment described hereinbelow. In the below, the organic solvent is shown with two different concepts, that is, with upper concept of organic solvent and with its specific organic solvent.

(R is an alkyl group, or a substituted alkyl group. Ar shows a phenyl group, or an aromatic ring except for a phenyl group).

Organic Solvent:
alcohols (R—OH)•alkoxyalcohols•ethers (R—O—R, Ar—O—R, Ar—O—Ar)•esters
ketones•glycols•alkylene glycols•glycol ethers Specific organic solvent of the above:
CH$_3$OH, C$_2$H$_5$OH, CH$_3$(CH$_2$)XOH•isopropyl alcohol (IPA)•ethoxyethanol•methoxyalcohol•long chain alkyl ester•monoethanolamine (MEA)• acetone• acetylacetone•dioxane•ethyl acetate•butyl acetate•toluene•methyl ethyl ketone (MEK)•diethyl ketone•dimethyl sulfoxide (DMSO)•methyl isobutyl ketone (MIBK)•butyl carbitol•n-butyl acetate (nBA)•gamma-butyrolactone•ethyl cellosolve acetate (ECA)•ethyl lactate•ethyl pyruvate•2-heptanone (MAK)•3-methoxybutyl acetate•ethylene glycol•propylene glycol•butylene glycol•ethylene glycol monoethyl ether•diethylene glycol monoethyl ether•ethylene glycol monoethyl ether acetate•ethylene glycol monomethyl ether•ethylene glycol monomethyl ether acetate•ethylene glycol mono-n-butyl ether• polyethylene glycol•polypropylene glycol•polybutylene glycol•polyethylene glycol monoethyl ether•polydiethylene glycol monoethyl ether•polyethylene glycol monoethyl ether acetate•polyethylene glycol monomethyl ether•polyethylene glycol monomethyl ether acetate•polyethylene glycol mono-n-butyl ether•methyl-3-methoxy propionate (MMP)•propylene glycol monomethyl ether (PGME)•propylene glycol monomethyl ether acetate (PGMEA)•propylene glycol monopropyl ether (PGP)•propylene glycol monoethyl ether (PGEE)•ethyl-3-ethoxy propionate (FEP)•dipropylene glycol monoethyl ether•tripropylene glycol monoethyl ether•poly propylene glycol monoethyl ether•propylene glycol monomethyl ether propionate•3-methoxy methyl propionate•3-ethoxy ethyl propionate•N-methyl-2-pyrrolidone (NMP)

A method for exposing to a vapor of organic solvent solution is picked up as a treatment for chemical dissolution reflow in the later process for explanation. A practical example of this treatment is as follows. An organic solvent, for example, N-methyl-2-pyrrolidone is filled 5 mm~15 mm in depth in a stainless steel tray having a depth of 20 mm. A treatment surface is turned over and the tray is overlaid with the treatment surface. In addition, a weight is put on the substrate for confining the vapor of organic solvent in a space between the stainless steel tray and the substrate. Temperatures of the substrate and organic solvent are maintained at room temperature (around 20° C.). Through the above, the treatment substrate is exposed to the organic solvent vapor, thus the vapor exposure treatment is conducted. When acetone or propylene glycol monoethyl ether, which has high density vapor, is used, the vapor exposure treatment is 0.1 minutes to 3 minutes. On the other hand, when tripropylene glycol monoethyl ether or N-methyl-2-pyrrolidone, which has low density vapor, is used, the treatment is 5 minutes to 20 minutes.

Under the condition of the above-described chemical solution, that is, under the condition that the organic solvent is permeated into the resist, the resist pattern 33 is dissolved, and a reflow (chemical solution dissolution reflow) will take place. It was found that the resist pattern 34 became hard by evaporation of the organic solvent in the resist pattern 34 within dozens of seconds to several minutes, although the time depends on a kind of organic solvent, when the supply of chemical solution was stopped. In addition, it was confirmed that the resist pattern 34 expanded during the dissolution due to permeation of chemical solution, however, the volume after the evaporation of chemical solution had shrunk. With the chemical reflow, the resist pattern 33 reflows as shown in FIG. 7C and expands in lateral direction. As a result, a distorted resist pattern 34 is formed. Since this chemical solution reflow has a lower viscosity compared with that of thermal reflow described in the above, it is possible to have a long reflowed distance. It was also confirmed that if the resist is treated 3 minutes in a vapor of, for example, acetone or propylene glycol monoethyl ether, which has a high density vapor, at room temperature (around 20° C.), the reflowed distance becomes 10 μm, and if the resist is treated over 5 minutes, it becomes over 20 μm in lateral direction. In this case, if the temperatures of the organic solvent and the substrate are high, or according to increase of substrate temperature relative to that of organic solvent, the exposure time for obtaining a desired reflowed distance becomes long. On the other hand, if the temperatures of the organic solvent and the substrate are low, the exposure time for obtaining the desired reflowed distance becomes short.

Figure 7D:
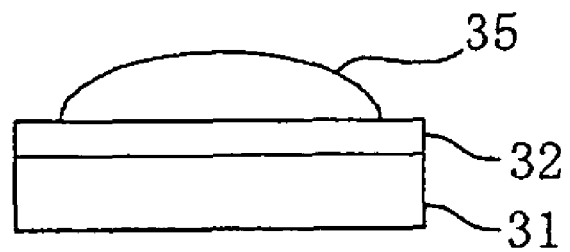
FIG. 7D is a partial traverse cross sectional view showing a method of wet etching according to the first embodiment of the present invention.
Figure 7E:
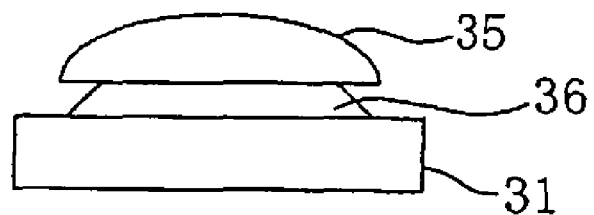
FIG. 7E is a partial traverse cross sectional view showing a method of wet etching according to the first embodiment of the present invention.

As shown in FIG. 7D, a resist mask 35, of which adhesion strength was adjusted with chromium film 32, has been formed by conducting a re-bake treatment for the purpose of adjusting adhesion strength between the distorted resist pattern 34 and the chromium film 32. With the mechanism described before, by adjusting the adhesion strength, an adjustment of taper angle of the etched chromium pattern becomes possible through wet etching which is implemented in the later process. For the purpose of confirming the relation between the taper angle of wet etched chromium pattern and a time and a temperature of the re-bake, the re-bake has been conducted at the temperature between 0° C. and 150° C., optimally at between 40° C. and 120° C., while fixing the time of the re-bake at 120 seconds. When the re-bake was conducted in this temperature range, the thermal reflow of resist pattern 34 has not taken place. A change of the adhesion strength between resist mask 35 and chromium film 32 is transformed into a change of the taper angle of wet etched chromium pattern implemented in the later process.

Using resist pattern 35, of which adhesion strength with chromium film 32 was adjusted, a normally tapered chromium pattern 35 has been formed with over-wet-etching of chromium film 32. When a front end position of over-wet-etching was located within the organic solvent permeated portion, a sloped etching surface has gradually proceeded to inside, that is, the over-wet-etching in horizontal direction has progressed, while maintaining the taper angle corresponding to the adjusted adhesion strength. However, when the front end position of over-wet-etching reached to the area of organic solvent non-permeated portion, the sloped etching surface, that is, the taper angle has gradually increased. Therefore, as described before on the mechanism of taperization by referring to FIG. 4, the critical time for the over-wet-etching means that the front end of over-wet-etching in horizontal direction at the upper portion of chromium film 32 has reached to the border between organic solvent permeated portion and organic solvent non-permeated portion of resist mask 35. That is, the critical time of the over-wet-etching depends on a time when the front end of over-wet-etching in horizontal direction at the upper portion of chromium film 32 reaches to the border between organic solvent permeated portion and organic solvent non-permeated portion of resist mask 35.

A taper angle of normally tapered chromium film pattern 36 was measured. The normally tapered chromium film pattern 36 has been formed by stopping the over-wet-etching before the front end of over-wet-etching in horizontal direction at the upper portion of chromium film 32 reaches to the border between organic solvent permeated portion and organic solvent non-permeated portion of resist mask 35, that is, within the critical time. The measurement was conducted with a well known method. That is, after etching treatment, the cross section of edge part of chromium film pattern was photographed with SEM (Scanning Electron Microscope), and the taper angle was measured from the photographed cross section. The resist mask was re-baked under different temperature conditions between 0° C. and 150° C., while fixing the re-bake time at 120 seconds. The over-wet-etching were conducted within the critical time using the resist masks which were re-baked at different temperature to each other, and the each taper angle of normally tapered chromium film pattern 36 has been measured. The result is shown in FIG. 8. FIG. 8 is a figure showing a relation between the re-bake treatment temperature of the resist mask and the taper angle of normally tapered chromium film pattern. The time for the re-bake treatment was fixed at 120 seconds.

As shown in FIG. 8, the higher the temperature of re-bake of resist pattern 35 is, the larger the taper angle of chromium film pattern 36 obtained by the over-wet-etching becomes. When a temperature range of re-bake treatment is less than 50° C., a difference of taper angle caused by the difference of re-bake treatment temperature was small. On the other hand, when the temperature range of re-bake treatment is 50° C. or more, an increase of taper angle has been remarkable. It was confirmed that the taper angle monotonically increases according to the increase of temperature when the temperature of re-bake is between 50° C. and 150° C. Therefore, it was confirmed that, by fixing the temperature of re-bake based on a required taper angle, the required taper angle, for example, from an angle less than 5 degrees, which is a substantially small taper angle, to 70 degrees, a large taper angle, can be achieved with high accuracy. When the re-bake treatment temperature is at around the room temperature (20° C.), the result may be similar to that of under uncontrolled natural condition. Therefore, if the required taper angle of chromium film 36 is substantially small, it may be possible to place the resist pattern under uncontrolled natural conditions without conducting the re-bake treatment of resist pattern 34 after organic solvent contact process shown in FIG. 7C.

In addition, an experiment similar to the above experiment has been conducted by varying the re-bake treatment time from 30 seconds to 360 seconds (This is the case where the time is varied at around 120 seconds), while fixing the re-bake treatment temperature at a temperature of between 0° C. and 150° C. As a result, it was confirmed that if the time of re-bake treatment was prolonged, the taper angle of chromium pattern 36 has been increased at any re-bake treatment temperature. That is, it was confirmed that the taper angle of chromium film pattern 36 has been increased by increasing the temperature and time of the re-bake treatment.

From the embodiment, the followings are confirmed. 1) An etching speed of over-wet-etching in horizontal direction depends on adhesion strength between the bottom of resist pattern and the chromium film, which is to be etched. 2) By adjusting the temperature and the time of the re-bake treatment which is implemented after the contact process of resist pattern with organic solvent, thereby adjusting the adhesion strength between the chromium film and the bottom of periphery portion of resist pattern, it becomes possible to control the taper angle of chromium film pattern, which is obtained by over-wet-etching using the resist pattern as a mask, in wide range and with high accuracy. However, if the temperature of the re-bake is room temperature, the re-bake treatment after the contact process of resist pattern with organic solvent may be put under uncontrolled natural condition.

The present embodiment may be modified as follows. An isotropic dry etching may be used instead of above wet etching.

In addition, for further promoting dissolution reflow of resist pattern 33 after post-bake treatment shown in FIG. 7B and before contact process of resist pattern with organic solvent shown in FIG. 7C, a removing process of deteriorated layer at a surface of resist pattern 33 may be implemented. The deteriorated layer removal process may be, for example, oxygen plasma treatment. It may be conducted under conditions of O2 flow rate: 300 sccm, 100 Pa, RF power for plasma generation: 1000 W, treatment time: 120 seconds. The removal process also may be UV ozone treatment, that is, it may be conducted by irradiating UV light in ozone gas atmosphere with substrate temperature 100° C. to 200° C. Through the treatment, the deteriorated layer is removed, and a uniform dissolution reflow, which is uniform regardless of inside portion or surface portion of the resist, takes place. The method and condition of the treatment are selected by measuring a removal rate of the deteriorated layer of resist surface.

In addition, by treating the deteriorated layer with a chemical solution, thereby partially or entirely removing the deteriorated layer, or introducing cracks into the deteriorated layer, it may be possible to permeate the organic solvent into the organic pattern. It is important to use a chemical solution which leaves non-deteriorated portion of organic film as it is and selectively removes only deteriorated layer, or introduce cracks into the deteriorated layer, thereby making easy to permeate the organic solvent into the organic film without removing or peeling off the organic film.

The deteriorated layer of organic pattern is supposed to be caused by a degradation with time, a thermal oxidation, a thermal hardening, an attachment of deposition film, an acid-based etching solution, an $O_2$ ashing, and others such as chemical changes due to use of dry etching gas. The chemical solution such as acid, an alkaline solution and an organic solvent mixed solution may be used. More specifically, it is a solution mixed with amine-based organic solution. The amines may include, for example, monoethylamine, diethylamine, triethylamine, monoisopropylamine, diisopropylamine, monobutylamine, dibutylamine, tributylamine, hydroxylamine, diethylhydroxylamine, diethylhydroxylamine anhydride, pyridine, and picoline. In addition, a typical anti-etching material including D-glucose ($C_6H_{12}O_6$), chelates, anti-oxidation agent may be added in some case. A concentration of the amines mixed into the solution is in a range of 0.05~10 wt %. For removing a lightly deteriorated layer, that is, in the case of deterioration caused by, for example, a degradation with time, an acid-based etching, and an isotropic $O_2$ ashing, the concentration may be the range of 0.05~3 wt %.

In addition, a treatment for wettability improvement of exposed surface of chromium base film may be conducted in addition to, or instead of the deteriorated layer removal process after the post-bake treatment shown in FIG. 7B and before the contact process of resist pattern with organic solvent shown in FIG. 7C. The method for improving the wettability is well known, and it is exemplified by the following three methods. (1) Dipping a substrate into fluoric acid, (2) Plasma treatment (O2, fluorine-based gases: SF6, CF4, CHF3, etc.), or surface treatment with a mixture of fluorine-based gases and oxygen (SF6/O2, CF4/O2, CHF3/O2, etc.), (3) Etching of a surface layer film with only wet etching, not with dry etching. With the above methods, smoothness and wettability of the film surface before the chemical reflow are improved. The surface is changed into hydrophilic. The method and condition of the above treatments are selected by measuring an improvement level of the wettability of base film surface.

Second Embodiment

[Organic pattern formation+Post-bake+Chemical treatment (without reflow)+Re-bake+Wet etching]

A second embodiment of the present invention will be explained below. FIG. 9A to FIG. 9E are partial traverse cross sectional views showing a method of wet etching according to the second embodiment of the present invention. Wet etching of the second embodiment shown in FIG. 9A to FIG. 9E is different from the first embodiment explained by referring to FIG. 7A to FIG. 7E in that the organic solvent which is not sufficient to cause the dissolution reflow is permeated in the resist pattern.

Figure 9A:
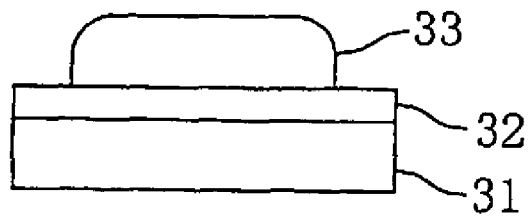
FIG. 9A is a partial traverse cross sectional view showing a method of wet etching according to the second embodiment of the present invention.

As shown in FIG. 9A, chromium film 32 has been formed on insulating substrate 31. A thickness of chromium film 32 is about 100 nm. Resist pattern 33 is formed on a predetermined area on chromium film 32 using a well known photolithography technology. A base structure of chromium film 32 is insulating substrate 31 in this case. However, the insulating substrate may be, for example, a transparent substrate such as glass for a liquid crystal display unit, an amorphous silicon, a silicon oxide, a silicon nitride, and a silicon oxide and a silicon nitride for semiconductor integral circuits.

Figure 9B:
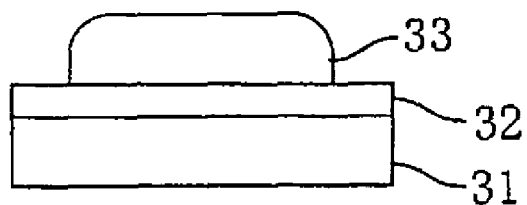
FIG. 9B is a partial traverse cross sectional view showing a method of wet etching according to the second embodiment of the present invention.

As shown in FIG. 9B, a post-bake treatment has been conducted for the purpose of increasing an adhesion strength between resist pattern 33 and chromium film 32. A temperature range of 0° C. to 150° C. is effective for the post-bake treatment. However, the post-bake treatment was conducted at the temperature range of 100° C. to 140° C. in this embodiment. A thermal reflow of resist pattern 33 has not caused by the post-bake treatment at this temperature range.

Figure 9C:
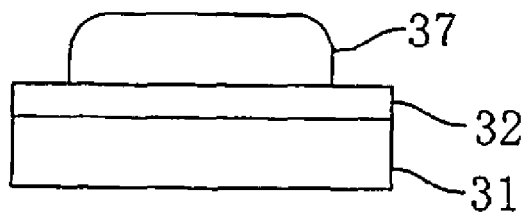
FIG. 9C is a partial traverse cross sectional view showing a method of wet etching according to the second embodiment of the present invention.

As shown FIG. 9C, by contacting resist pattern 33 with a chemical solution containing organic solvent, resist pattern 37, in which organic solvent is permeated, has been formed. However, different from the first embodiment, a chemical solution containing the organic solvent, which is not enough to cause the dissolution reflow, has been permeated into resist pattern 37. Practically, resist pattern 33 may be exposed to a vapor of chemical solution or may be dipped into a substantially diluted chemical solution. For example, when resist pattern 33 is exposed to a vapor of chemical solution using acetone or propylene glycol monoethyl ether, which have high density vapor at room temperature (around 20° C.), the treatment time is 10 to 120 seconds. On the other hand, when resist pattern 33 is exposed to a vapor of chemical solution using tripropylene glycol monoethyl ether or N-methyl-2-pyrrolidone, which has low density vapor at room temperature (around 20° C.), the treatment time is 3 to 7 minutes. Although the above chemical solution, that is, the solution of organic solvent was permeated, the dissolution reflow of resist pattern 33 has not taken place when the permeated volume was small. When a supply of the chemical solution was stopped, the organic solvent in resist pattern 37 has evaporated within dozens of seconds to several minutes although it depends on a kind of organic solvent. In addition, it was confirmed that, since resist pattern 37 was expanded due to permeation of organic solvent, it has shrunk after evaporation of chemical solution.

Figure 9D:
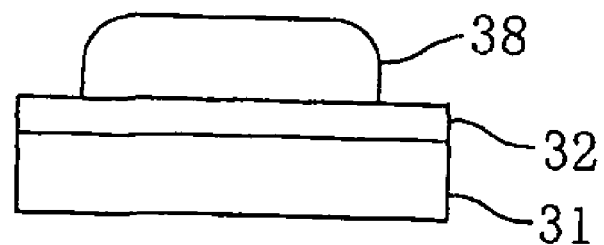
FIG. 9D is a partial traverse cross sectional view showing a method of wet etching according to the second embodiment of the present invention.

As shown in FIG. 9D, by conducting a re-bake treatment for the purpose of adjusting adhesion strength between a distorted resist pattern 37 and chromium film 32, resist mask 38 having an adjusted adhesion strength with chromium film 32 has been formed. With the mechanism described in the above, by adjusting the adhesion strength, it becomes possible to adjust a taper angle of etched chromium pattern through wet etching, which is to be implemented in the later process. For the purpose of confirming a relation between the taper angle of wet etched chromium pattern and a time and a temperature of the re-bake, as with the first embodiment, the re-bake has been conducted at the temperature range of 0° C. to 150° C., optimally, at the range of 40° C. to 120° C., while fixing the time of the re-bake 120 seconds.

When the re-bake was conducted at this temperature range, a thermal reflow of resist pattern 34 has not taken place. A change of adhesion strength between resist mask 38 and chromium film 32 is transformed into a change of taper angle of wet etched chromium pattern through wet etching to be implemented in the later process.

Figure 9E:
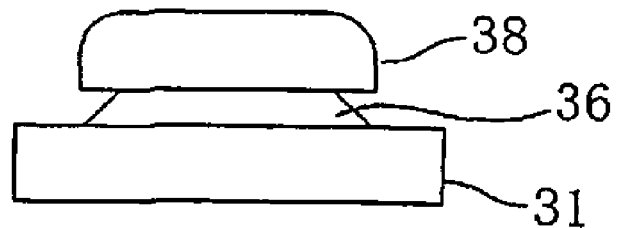
FIG. 9E is a partial traverse cross sectional view showing a method of wet etching according to the second embodiment of the present invention.

Next, as shown in FIG. 9E, by using resist pattern 38 of which adhesion strength with chromium film 32 is adjusted, a normally tapered chromium pattern 36 has been formed by over-wet-etching of chromium film 32. When a front end position of over-wet-etching was located within the area of organic solvent permeated portion, a sloped etching surface has gradually proceeded to the inside, that is, the over-wet-etching in horizontal direction has progressed, while maintaining a taper angle corresponding to the adjusted adhesion strength. However, when the front end position of over-wet-etching reached to the area of organic solvent non-permeated portion, the sloped etching surface, that is, the taper angle has gradually increased.

Therefore, as described before on the mechanism of taperization by referring to FIG. 3, a critical time for the over-wet-etching means that the front end of over-wet-etching in horizontal direction at the upper portion of chromium film 32 has reached to the border between organic solvent permeated portion and organic solvent non-permeated portion of resist mask 38. That is, the critical time of the over-wet-etching depends on a time when the front end of over-wet-etching in horizontal direction at the upper portion of chromium film 32 reaches to the border between organic solvent permeated portion and organic solvent non-permeated portion of resist mask 38.

A taper angle of normally tapered chromium film pattern 36 has been measured. The normally tapered chromium film pattern 36 was formed by stopping the over-wet-etching before the front end of over-wet-etching in horizontal direction at the upper portion of chromium film 32 reaches to the border between organic solvent permeated portion and organic solvent non-permeated portion of resist mask 38, that is, within the critical time. The measurement was conducted with a well known method. That is, after etching treatment, the cross section of edge part of chromium film pattern was photographed with SEM (Scanning Electron Microscope), and the taper angle was measured from the photographed cross section. The resist mask was re-baked at different temperature between 0° C. and 150° C., while fixing the re-bake time at 120 seconds. The over-wet-etching was conducted within the critical time using the resist mask re-baked at different temperature, and each taper angle of normally tapered chromium film pattern 36 was measured. The result was identical to that of the first embodiment. That is, although the present embodiment is different from the first embodiment in that a position of the border between the organic solvent permeated portion and the organic solvent non-permeated portion, that is, the critical time of over-wet-etching is different, however, the followings were commonly observed.

As with the result of the first embodiment shown in FIG. 8, the higher the temperature of re-bake of resist pattern 38 is, the larger the taper angle of chromium film pattern 36, which is obtained by the over-wet-etching, becomes. When a temperature range of re-bake treatment was less than 50° C., a difference of taper angle caused by the difference of re-bake treatment temperature was small. On the other hand, when the temperature range of the re-bake treatment was 50° C. or more, an increase of taper angle has been remarkable. It was confirmed that the taper angle monotonically increases according to the increase of temperature when the temperature range of the re-bake is between 50° C. and 150° C. Therefore, it was confirmed that, by fixing the temperature of re-bake based on a required taper angle, the required taper angle, for example, from an angle less than 5 degrees, which is a substantially small taper angle, to 70 degrees, a large taper angle, can be achieved with high accuracy. When the re-bake treatment temperature is at around the room temperature (20° C.), the result might be similar to that of under uncontrolled natural condition. Therefore, if the required taper angle of chromium film 36 is substantially small, it may be possible to place the resist pattern under uncontrolled natural condition without conducting re-bake treatment of resist pattern 37 after organic solvent contact process shown in FIG. 9C.

In addition, an experiment similar to the above experiment has been conducted by varying the re-bake treatment time from 30 seconds to 360 seconds (This is the case where the time is varied at around 120 seconds), while fixing the re-bake treatment temperature between 0° C. and 150° C. As a result, it was confirmed that if the time of re-bake treatment is prolonged, the taper angle of chromium pattern 36 is increased at any re-bake treatment temperature. That is, it was confirmed that the taper angle of chromium film pattern 36 is increased by increasing the temperature and time of re-bake treatment.

As with the above first embodiment, the followings have been confirmed by the second embodiment. 1) An etching speed of over-wet-etching in horizontal direction depends on adhesion strength between the bottom of resist pattern and the chromium film, which is to be etched. 2) By adjusting a temperature and a time of the re-bake treatment, which is implemented after a contact process of resist pattern with organic solvent, thereby adjusting the adhesion strength between chromium film and the bottom of periphery portion of resist pattern, it becomes possible to control a taper angle of chromium film pattern, which is obtained by over-wet-etching using the resist pattern as a mask, in wide range and with high accuracy. However, if the temperature of the re-bake is room temperature, the re-bake treatment after contact process of resist pattern with organic solvent may be under uncontrolled natural condition.

Comparing the present embodiment with the first embodiment, the following has been further confirmed. 3) When over-wet-etching is used, the etching speed can be controlled by adjusting adhesion strength between the bottom of resist pattern and chromium film to be etched regardless of cross sectional shape of resist pattern periphery as a mask, that is, regardless whether it is a reflowed resist pattern or a non-reflowed resist pattern. As a result, adjustment of the taper angle of chromium film pattern becomes possible.

Third Embodiment

[Organic pattern formation+Post-bake+Chemical treatment (with reflow)+Re-bake+Anisotropic dry etching]

Figure 10A:
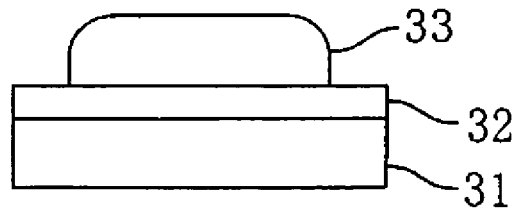
FIG. 10A is a partial traverse cross sectional view showing a method of anisotropic dry etching according to the third embodiment of the present invention.

A third embodiment of the present invention will be described below. FIG. 10A to FIG. 10E are partial traverse cross sectional views showing a method of anisotropic dry etching according to the third embodiment of the present invention. As shown in FIG. 10A, chromium film 32 has been formed on insulating substrate 31. A thickness of chromium film 32 is about 100 nm. Resist pattern 33 was formed on a predetermined area on chromium film 32 using a well known photolithography technology. A base structure of chromium film 32 is an insulating substrate 31 in this case. However, the insulating substrate may be, for example, a transparent substrate such as glass for a liquid crystal display apparatus, an amorphous silicon, a silicon oxide, a silicon nitride, and a silicon oxide and a silicon nitride for semiconductor integral circuits.

Figure 10B:
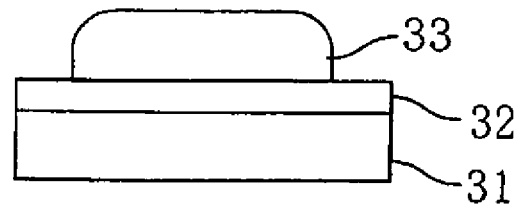
FIG. 10B is a partial traverse cross sectional view showing a method of anisotropic dry etching according to the third embodiment of the present invention.

As shown in FIG. 10B, a post-bake treatment has been conducted for the purpose of increasing an adhesion strength between resist pattern 33 and chromium film 32. A temperature range of 0° C. to 150° C. is effective for the post-bake treatment. However, the post-bake treatment was conducted at the temperature range of 100° C. to 140° C. in this embodiment. A thermal reflow of resist pattern 33 has not caused by the post-bake treatment at this temperature range.

Figure 10C:
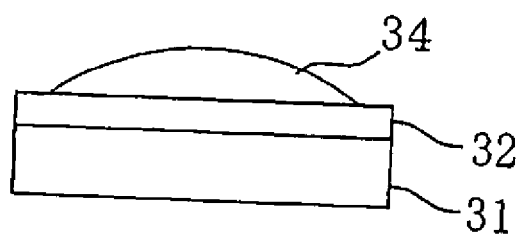
FIG. 10C is a partial traverse cross sectional view showing a method of anisotropic dry etching according to the third embodiment of the present invention.

As shown in FIG. 10C, resist pattern 33 has been contacted with a chemical solution containing organic solvent. Resist pattern 33 may be exposed to a vapor of chemical solution or may be dipped into a substantially diluted chemical solution. Practically, when resist pattern 33 is exposed to the vapor of chemical solution using acetone or propylene glycol monoethyl ether, which have high density vapor at room temperature (around 20° C.), an exposure time is 0.1 to 3 minutes. On the other hand, when resist pattern 33 is exposed to the vapor of chemical solution using tripropylene glycol monoethyl ether or N-methyl-2-pyrrolidone, which has low density vapor at room temperature (around 20° C.), the exposure time is 5 to 20 minutes. When temperatures of the organic solvent and the substrate are high, or according to increase of substrate temperature relative to that of organic solvent, the exposure time to the vapor of chemical solution for causing the dissolution reflow becomes long. On the other hand, when the temperatures of the organic solvent and the substrate are low, the exposure time to the vapor of chemical solution for causing the dissolution reflow becomes short. In the dipping treatment into the organic solvent solution having a substantially diluted concentration, if the concentration of organic solvent is high, the resist dissolves into organic solvent, and a peeling off of the resist is caused. Therefore, the concentration of organic solvent in the solution must be adjusted so as to not to cause the dissolution peeling off, while permeating a part of organic solvent into the resist.

Under the condition of the above-described chemical solution, that is, under the condition that the organic solvent solution is permeated into the resist, resist pattern 33 is dissolved and a reflow (chemical solution dissolution reflow) takes place. According to increase of time of the dissolution reflow process, a dimension of resist pattern 34 distorted by the dissolution reflow increases, while decreasing the taper angle. When a supply of chemical solution was stopped, it was found that the resist pattern 34 has been hardened within dozens of seconds to several minutes by evaporation of organic solvent in the resist pattern 34, although the time depends on a kind of organic solvent. In addition, it was confirmed that the resist pattern 34 was expanded during the dissolution due to permeation of chemical solution. However, the volume had shrunk after evaporation of chemical solution. With the chemical reflow, resist pattern 33 reflows as shown in FIG. 10C, thereby expanding in lateral direction. As a result, the distorted resist pattern 34 is formed. The distorted resist pattern 34 is different from that shown in FIG. 10B in dimension and shape. Since this chemical solution reflow has a lower viscosity compared with that of the thermal reflow described before, it is possible to achieve a long reflowed distance.

A thermal reflow causes an increase of dimension in horizontal direction, while, as described, volume shrinkage of organic pattern takes place by heat treatment of organic pattern. That is, the thermal reflow causes the volume shrinkage of organic pattern by heat, as well as the increase of dimension in horizontal direction by fluidization. Therefore, the increase of dimension in horizontal direction is not so large as that of dissolution reflow. On the other hand, the dissolution reflow causes volume expansion of organic pattern by permeation of organic solvent in addition to increase of dimension in horizontal direction by fluidization. As a result, it is better to use the dissolution reflow rather than the thermal reflow for shrinking a distance between patterns.

In addition, it was confirmed that if the resist is treated 3 minutes at room temperature (around 20° C.) in a vapor of, for example, acetone or propylene glycol monoethyl ether, which has a high density vapor, the reflowed distance becomes 10 μm, and if the resist is treated over 5 minutes, the distance becomes over 20 μm in lateral direction. When the temperatures of the organic solvent and the substrate are high, or according to increase of substrate temperature relative to that of organic solvent, an exposure time for obtaining a desired reflowed distance becomes long. On the other hand, if the temperatures of the organic solvent and the substrate are low, the exposure time for obtaining the desired reflowed distance becomes short.

Figure 10D:
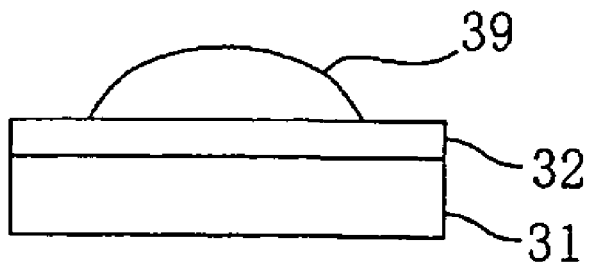
FIG. 10D is a partial traverse cross sectional view showing a method of anisotropic dry etching according to the third embodiment of the present invention.

As shown in FIG. 10D, resist mask 39, of which shape and dimension were adjusted by conducting a re-bake treatment for adjusting the shape and dimension of the distorted resist pattern 34, once dissolution reflowed, has been formed. With the mechanism described before, by conducting the heat treatment, thereby adjusting a cross sectional shape of periphery part of distorted resist pattern which was once dissolution reflowed, especially, by adjusting a taper angle of resist pattern 34, it becomes possible to control the taper angle of etched chromium pattern by dry etching to be implemented in the later process. If the taper angle of distorted resist pattern 34 obtained through the above dissolution reflow is smaller than a desired angle, that is, if the slope of distorted resist pattern 34 is too small, the re-bake treatment is conducted after dissolution reflow process, thereby adjusting the dimension and taper angle of the distorted resist pattern 34. As a result, resist pattern 39 having the desired dimension and taper angle can be formed. For confirming a relation between dissolution reflow treatment time and a taper angle of wet etched chromium pattern, the re-bake treatment was conducted by fixing the temperature and time of the re-bake treatment at 120° C. and 120 seconds. When the re-bake treatment was conducted under conditions of these temperature and time, volume shrinkage of resist pattern 34 has taken place, but a thermal reflow has not taken place. The taper angle after the re-bake treatment is smaller than that before the dissolution reflow, and larger than that of just after the dissolution reflow. A change of taper angle of the distorted resist pattern 39 is transformed into a change of taper angle of etched chromium pattern by dry etching to be implemented later.

In practice, it is not easy to adjust the dimension and taper angle of resist pattern to the desired values with high accuracy by dissolution reflow. When a resist pattern is distorted by dissolution reflow, the taper angle of distorted resist pattern 34 may become smaller than the desired angle in some case. In this case, the re-bake treatment is conducted as a heat treatment, thereby, whit the mechanism described before, causing volume shrinkage of distorted resist pattern 34. As a result, the taper angle is increased to become the desired angle. This means that conditions of dissolution reflow treatment can be relaxed by conducting the re-bake treatment for adjusting the taper angle and dimension of the distorted resist pattern after the dissolution reflow of resist pattern. Therefore, it may be enough for the dissolution reflow of resist pattern that if it is conducted under a limitation that the taper angle of the distorted resist pattern after the dissolution reflow treatment is the desired angle or less. Then, if the taper angle of the distorted resist pattern after the dissolution reflow treatment is smaller than the desired angle, the taper angle of resist pattern is increased, that is, adjusted, to become the desired angle by implementing the re-bake treatment after the dissolution reflow treatment.

Figure 10E:
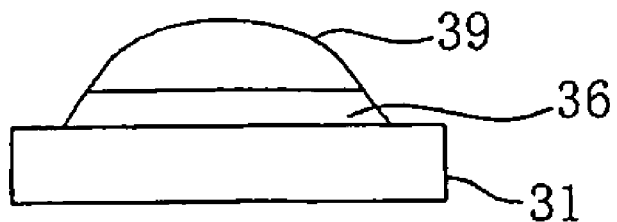
FIG. 10E is a partial traverse cross sectional view showing a method of anisotropic dry etching according to the third embodiment of the present invention.

Next, as shown in FIG. 10E, by using resist mask 39, which taper angle was adjusted, as a mask, chromium film mask 32 has been anisotropically dry etched to form normally tapered chromium film pattern 36. As described before by referring to FIG. 5 and FIG. 6 on the mechanism of taperization of anisotropic dry etching, a taper angle of anisotropically dry etched chromium pattern 36 depends on a taper angle of resist pattern 39 which is used as a mask.

A relation between a time of dissolution reflow treatment and a taper angle of resist pattern 39 has been described before. A relation between a time of dissolution reflow treatment and a taper angle of chromium film pattern 36, which was formed by anisotropically dry etching using resist pattern 39 as a mask, has been confirmed under conditions below. The time of dissolution reflow treatment was varied between 0 to 300 seconds. The time and temperature of the re-bake for adjusting the taper angle of resist pattern 34 after dissolution reflow were fixed at 120 seconds and 120° C. Chromium film 32 has been dry etched under conditions below using the resist mask of which taper angle was adjusted after the re-bake treatment. Dry etching gases, Cl2/O2=300/200 (sccm), or Cl2/He/O2=300/100/200 (sccm) were supplied. RF power was set at 1500 W. Pressure was set between 10 Pa to 20 Pa. The dry etching has been conducted 120 seconds under these conditions. The thickness of chromium film was 100 nm in this case. The taper angle of normally tapered chromium film pattern 36, of which dissolution reflow treatment time was varied from 0 to 300 seconds, has been measured.

Figure 11:
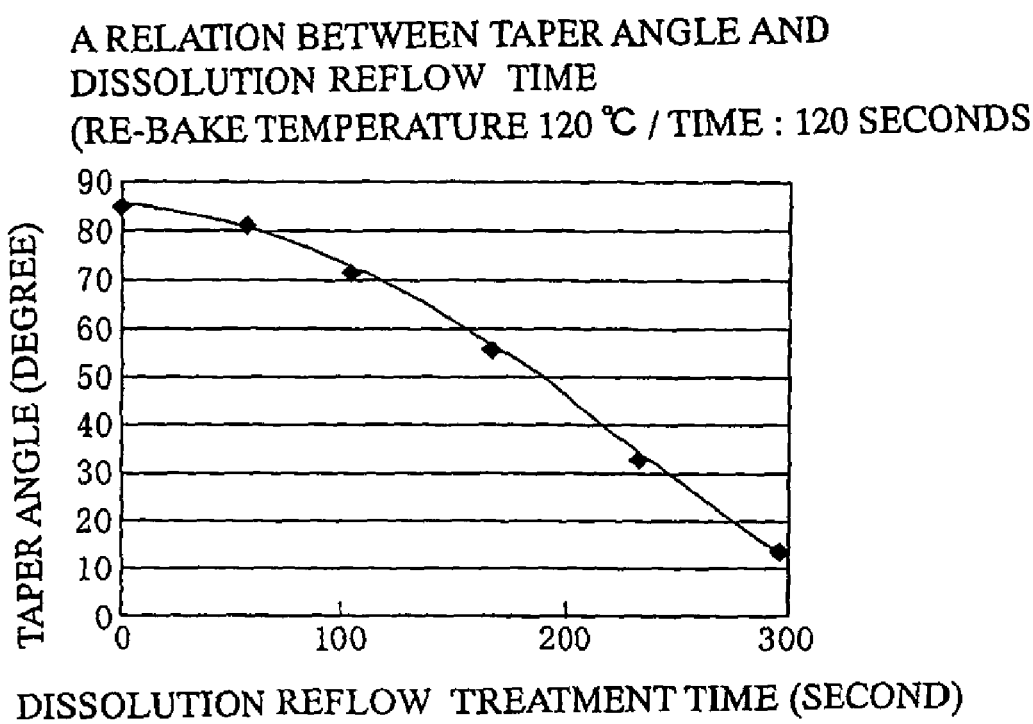
FIG. 11 shows a relation between a time of dissolution reflow treatment and a taper angle of anisotropically dry etched chromium film pattern.

The result is shown in FIG. 11. FIG. 11 shows a relation between a dissolution reflow treatment time and a taper angle of anisotropically dry etched chromium film pattern. FIG. 11 directly shows that, the longer the dissolution reflow treatment time is, the smaller the taper angle of anisotropically dry etched chromium film pattern becomes. The fact that the taper angle of resist pattern 34 just after the dissolution reflow becomes small according to increase in time of dissolution reflow treatment has been described before. In addition, since the conditions of re-bake treatment and dry etching were fixed, FIG. 11 also indirectly shows that, the smaller the taper angle of resist pattern 39 is, the smaller the taper angle of anisotropically dry etched chromium film pattern 36 becomes. That is, it has been confirmed that a taper angle of anisotropically dry etched chromium film pattern 36 depends on a taper angle of resist pattern 39 as a mask. In the present invention, by conducting a heat treatment for adjusting a taper angle of resist pattern 39 which is used as a mask, it becomes possible to adjust a taper angle of ansotropically dry etched chromium film pattern 36 to be a desired angle with high accuracy. It is also possible to have a wide range of adjustable taper angle.

Figure 12A:
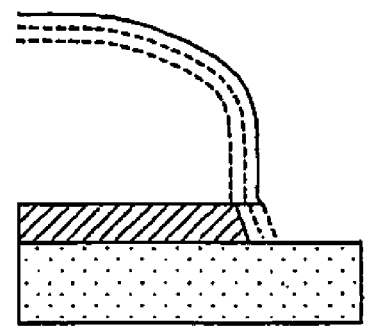
FIG. 12A is a partial traverse cross sectional view schematically showing a taper angle of chromium film pattern obtained by anisotropically dry etching using a resist pattern as a mask which is not dissolution reflowed.
Figure 12B:
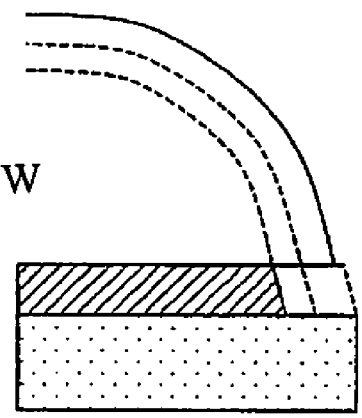
FIG. 12B is a partial traverse cross sectional view schematically showing a taper angle of chromium film pattern obtained by anisotropically dry etching using a resist pattern as a mask which is a little dissolution reflowed.
Figure 12C:
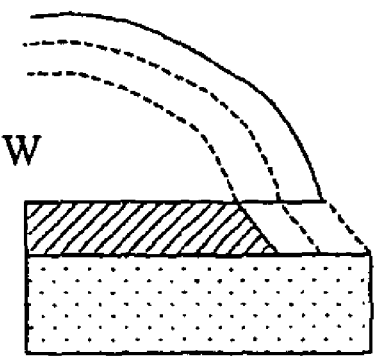
FIG. 12C is a partial traverse cross sectional view schematically showing a taper angle of chromium film pattern obtained by anisotropically dry etching using a resist pattern as a mask which is dissolution reflowed more than that of shown in FIG. 12B.
Figure 12D:
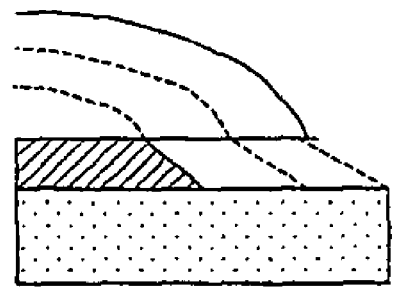
FIG. 12D is a partial traverse cross sectional view schematically showing a taper angle of chromium film pattern obtained by anisotropically dry etching using a resist pattern as a mask which is further dissolution reflowed than that of shown in FIG. 12C.

FIG. 12A to FIG. 12D show a relation between a taper angle of resist pattern as a mask and a tape angle of anisotropically dry etched chromium film etched by using the mask. That is, FIG. 12A is a partial traverse cross sectional view schematically showing a taper angle of chromium film pattern which is obtained by anisotropically dry etching using the resist pattern as a mask which is not dissolution reflowed. FIG. 12B is a partial traverse cross sectional view schematically showing a taper angle of chromium film pattern which is obtained by anisotropically dry etching using the resist pattern as a mask which is a little dissolution reflowed. FIG. 12C is a partial traverse cross sectional view schematically showing a taper angle of chromium film pattern which is obtained by anisotropically dry etching using the resist pattern as a mask which is dissolution reflowed more than FIG. 12B. FIG. 12D is a partial traverse cross sectional view schematically showing a taper angle of chromium film pattern which is obtained by anisotropically dry etching using the resist pattern as a mask which is further dissolution reflowed than FIG. 12C. From FIG. 12A to FIG. 12D, it can be understood that, the smaller the taper angle of resist pattern is, the smaller the taper angle of chromium film pattern obtained by anisotropically dry etching becomes.

From this embodiment, the followings have been confirmed. 1) A taper angle of anisotropically dry etched chromium film pattern depends on a taper angle of resist pattern as a mask. 2) By conducting a heat treatment for adjusting a taper angle of resist pattern which is used as a mask, an adjustment of a taper angle of ansotropically dry etched chromium film pattern to be a desired angle becomes possible with high accuracy. A wide adjustable range of the taper angle also becomes possible.

POSSIBILITY FOR INDUSTRIAL APPLICATION

The present invention is applicable to all if they relate to methods for organic mask formation, and for isotropic and anisotropic etching. There is no limitation on the application.

While the present invention has been described by associating with some preferred embodiments and examples, it is to be understood that these embodiments and examples are merely for illustrative of the invention by an example, and not restrictive. While it will be obvious to those skilled in the art that various changes and substitutions by equivalent components and techniques are eased upon reading the specification, it is believed obvious that such changes and substitutions fit into the true scope and spirit

What is claimed is:

1. A method for forming a pattern, comprising the steps of:
   contacting an organic pattern with an organic solvent so that the organic solvent permeates a portion of the organic pattern, the organic pattern containing at least one organic material;
   stopping the contacting of the organic pattern with the organic solvent thereby forming an organic solvent permeated portion of the organic pattern and a non-permeated portion of the organic pattern
   heat treating the organic pattern to form an organic mask; and
   etching a base film by wet etching or isotropic dry etching using the organic mask.

2. The method of claim 1, wherein the organic solvent permeated portion is a periphery of the organic pattern and the non-permeated portion is a central portion of the organic pattern.

3. The method of claim 1, wherein an adhesion strength of the base film at a bottom of a periphery of the organic pattern is lower than an adhesion strength of the base film at a bottom of a central portion of the organic pattern.

4. The method of claim 1, wherein a taperization of a cross-section of the base film is controlled by the method.

5. The method of claim 1, wherein a temperature of the heat treatment is between 40° C. and 120° C.

6. The method of claim 1, further comprising the step of continuing the contacting step so that the organic solvent permeates into a bottom of the organic pattern beyond a final etching position at an upper portion of the base film.

7. The method of claim 1, further comprising the step of stopping the etching before a front of an etching position in a horizontal direction at an upper portion of the base film exceeds a border between a bottom of the organic solvent permeated portion and a bottom of the non-permeated portion.

8. The method of claim 1, further comprising the steps of stopping the contacting step before dissolution reflow of the organic pattern, and
   forming the organic mask that is not tapered, wherein an adhesion strength at a bottom of the non-permeated portion is lower than an adhesion strength at a bottom of the organic solvent permeated portion.

9. The method of claim 1, further comprising a heat treatment step before the contacting step, the heat treatment step being carried out at a temperature higher than a minimum temperature necessary for increasing an adhesion strength between the base film and a bottom of the organic pattern and lower than a temperature at which the organic pattern deteriorates and prevents permeation of the organic solvent.

10. The method of claim 9, wherein a temperature range of the heat treatment step is from 100° C. to 150° C.

* * * * *